United States Patent
Tokukra et al.

(10) Patent No.: US 8,221,198 B2
(45) Date of Patent: Jul. 17, 2012

(54) POLISHING APPARATUS FOR POLISHING A WORK HAVING TWO SURFACES

(75) Inventors: Fumihiko Tokukra, Kawasaki (JP); Mitsuo Takeuchi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 1005 days.

(21) Appl. No.: 12/155,118

(22) Filed: May 29, 2008

(65) Prior Publication Data

US 2009/0075574 A1    Mar. 19, 2009

(30) Foreign Application Priority Data

Aug. 9, 2007    (JP) .................. 2007-208398

(51) Int. Cl.
B24B 41/06    (2012.01)
(52) U.S. Cl. ........ 451/402; 451/261; 451/262; 451/269; 451/442
(58) Field of Classification Search ............... 451/261, 451/262, 263, 264, 265, 267, 269, 402, 442
See application file for complete search history.

(56) References Cited

U.S. PATENT DOCUMENTS

| | | | | |
|---|---|---|---|---|
| 4,739,589 A * | 4/1988 | Brehm et al. | .................. | 451/41 |
| 5,914,053 A * | 6/1999 | Masumura et al. | ............. | 216/88 |
| 6,416,393 B2 * | 7/2002 | Fabry et al. | ..................... | 451/41 |
| 6,454,635 B1 | 9/2002 | Zhang et al. | | |
| 7,008,308 B2 * | 3/2006 | Bjelopavlic et al. | .......... | 451/269 |
| 2002/0115387 A1 * | 8/2002 | Wenski et al. | .................. | 451/41 |
| 2006/0128276 A1 * | 6/2006 | Horiguchi et al. | ............. | 451/41 |
| 2006/0178089 A1 * | 8/2006 | Ueno | ............................. | 451/41 |
| 2007/0021042 A1 | 1/2007 | Schmolke et al. | | |

FOREIGN PATENT DOCUMENTS

| | | |
|---|---|---|
| CN | 86101702 B | 12/1998 |
| CN | 1901142 A | 1/2007 |
| DE | 102005034119 | 12/2006 |
| JP | 62-162463 | 7/1987 |
| JP | 01-092063 | 4/1989 |
| JP | 1-114264 | 8/1989 |
| JP | 08-132344 | 5/1996 |
| JP | 2000-288921 | 10/2000 |
| JP | 2000-305069 | 11/2000 |
| JP | 2004-291115 | 10/2004 |
| JP | 2006-68895 | 3/2006 |
| KR | 10-2007-0012230 | 1/2007 |
| WO | 2006/013996 | 2/2006 |

OTHER PUBLICATIONS

European Search Report issued on Dec. 11, 2008 in corresponding European Patent Application No. 08157349.5.
Korean Office Action dated Feb. 24, 2010 and issued in corresponding Korean Patent Application 10-2008-0051042.
Japanese Patent Office Action dated Apr. 16, 2012 in Application No. 2007-208398.

* cited by examiner

Primary Examiner — Timothy V Eley
(74) Attorney, Agent, or Firm — Staas & Halsey LLP

(57) ABSTRACT

A polishing apparatus is configured to simultaneously polish both surfaces of a work, and includes a carrier having a hole configured to house the work, and a fixing member that contacts and fixes the work located in the hole.

3 Claims, 33 Drawing Sheets

POLISHING APPARATUS FOR POLISHING A WORK HAVING TWO SURFACES

This application claims a foreign priority benefit based on Japanese Patent Application 2007-208398, filed on Aug. 9, 2007, which is hereby incorporated by reference herein in its entirety as if fully set forth herein.

BACKGROUND OF THE INVENTION

1. Field of the Invention

The present invention relates generally to a polishing apparatus and more particularly to a polishing apparatus configured to polish both surfaces of a work. For example the present invention may be applied to a Chemical Mechanical Polishing or Planarization ("CMP") polishing apparatus.

2. Description of the Related Art

A Micro Electro Mechanical System ("MEMS") sensor is one example of MEMS and needs to be maintained in a vacuum environment by bonding a glass substrate to both sides of a MEMS chip having a sensing function. Accordingly, the MEMS chip side of the glass substrate needs to have a high degree of flatness. The manufacture becomes more convenient when the front and back surfaces of the glass substrate are not distinguished during manufacturing. For these reasons, there is a demand to polish both the front and back surfaces of each glass substrate with the same degree of flatness.

A polishing process includes a finishing (rough lapping) step that roughly laps a surface with a surface roughness RA between 1 μm to 200 nm, and a super finishing step that highly precisely laps the surface with a surface roughness Ra of several nanometers. Japanese Patent Application, Publication No. ("JP") 2000-305069 proposes use of a CMP apparatus for the super finishing step. A conventional CMP apparatus requires a glass substrate to be detached, reversed, and mounted again, after one surface of the glass substrate is polished, in order to polish both surfaces of the glass substrate.

Simultaneous polishing of both surfaces of the substrate preferably improves a throughput in the CMP in comparison with separate polishing of each surface one by one. In this case, use of a double-sided polishing apparatus for the finishing step is proposed as in JP 1-92063. Therefore, the inventers have reviewed an application of the double-sided polishing to the CMP process.

The work contacts a pad mounted on a stool during polishing whatever the polishing is the finishing step or the CMP step. JP 1-92063 inserts the work into an accommodation part in a jig (which will be referred to as a "carrier" in this application) at a predetermined fitting, and mounts them on the polishing apparatus.

As polishing proceeds, the degree of flatness of a polished surface of the work becomes higher, and an adhesion to the pad surface (polishing surface) or a frictional force increases. However, because the lower and upper stools rotate in opposite directions to one another, the work may oscillate in the accommodation part and collide with the carrier due to the frictional force and fitting, causing a chip of its edge or a generation of dust. As a result, the work may get damaged with the dust entering a space between the pad surface and the polished surface of the work, and the degree of flatness lowers. Highly precise polishing requires a dust generation preventive measure, and a prompt removal of any generated dust or a protection of the work from the dust.

BRIEF SUMMARY OF THE INVENTION

The present invention is directed to a polishing apparatus that has high polishing precision, and is configured to simultaneously polish both surfaces of the work.

A polishing apparatus according to one aspect of the present invention configured to simultaneously polish both surfaces of a work includes a carrier having a hole configured to house the work, and a fixing member that contacts and fixes the work located in the hole. According to the polishing apparatus, the fixing member fixes the work in the hole, preventing a vibration of the work in the hole and a collision of the work with the carrier. Thus, the fixing member prevents a chip and a dust generation, and consequently maintains the polishing precision of the work. The fixing member may be an adhesive that bonds the work to the carrier or an elastic member (such as a wire ring) that applies an elastic force to the work in the hole.

The polishing apparatus according to another aspect of the present invention configured to simultaneously polish both surfaces of a work includes a carrier having a hole configured to house the work; and an elastic member located between the work located in the hole and the carrier. According to this polishing apparatus, even when the work vibrates in the hole, the elastic member prevents a collision between the work and the carrier, and a chip and a dust generation, and consequently maintains the polishing precision of the work. For example, the elastic member is fixed to at least a part of outer circumferential side surface of the work or at least a part of contour surface of the carrier which defines the hole.

A carrier according to yet another aspect of the present invention used in a polishing apparatus configured to simultaneously polish both surfaces of a work has a hole configured to house the work. The carrier includes a pattern of a convex and a concave on at least one of both surfaces opposite to a pair of polishing surfaces in the polishing apparatus. The convexo-concave pattern of the carrier serves to facilitate a removal of the dusts from the surface of the work. The pattern is, for example, a plurality of through-holes, each of which is provided outside the hole, smaller than the hole, and perforates both the surfaces, or a groove that is provided in at least one of both the surfaces. The groove may extend linearly and/or curvedly or extend form a center of the carrier. The polishing apparatus having the carrier also constitutes one aspect of the present invention.

The polishing apparatus may further include a pattered (or convexo-concave) pad on a polishing surface that polishes the work. The pattern (or convexes and concaves) of the pad can remove the dusts from the top of the work.

The polishing apparatus may polish the work by CMP because the CMP needs a precise planarization and requires a prevention and removal of the dust.

A substrate manufacturing method according to another aspect of the present invention includes the steps of making a substrate, and processing the substrate. The making step includes a rough lapping step of lapping a work, and a super finishing step of chemically and mechanically polishing the work. At least one of the rough lapping step and the super finishing step uses the above polishing apparatus.

A substrate manufacturing method according to another aspect of the present invention includes the steps of making a substrate, processing the substrate, and planarizing the substrate. At least one of the making step and the planarizing step include a rough lapping step of lapping a work, and a super finishing step of chemically and mechanically polishing the work. At least one of the rough lapping step and the super finishing step uses the above polishing apparatus. Thus, in the manufacture of the substrate, highly precise polishing can be provided through a prevention of a dust generation and a removal of the generated dust.

An electronic apparatus manufacturing method according to another aspect of the present invention includes the steps of manufacturing the substrate using the above substrate manufacturing method, manufacturing an electronic component, and manufacturing an electrical apparatus from the substrate and the electronic component. The electronic apparatus manufacturing method can also exhibit an operation similar to the above substrate manufacturing method.

Further detailed objects and other characteristics of the present invention will become apparent by the preferred embodiments described below referring to accompanying drawings which follow.

DESCRIPTION OF THE EMBODIMENTS

Figure 1:
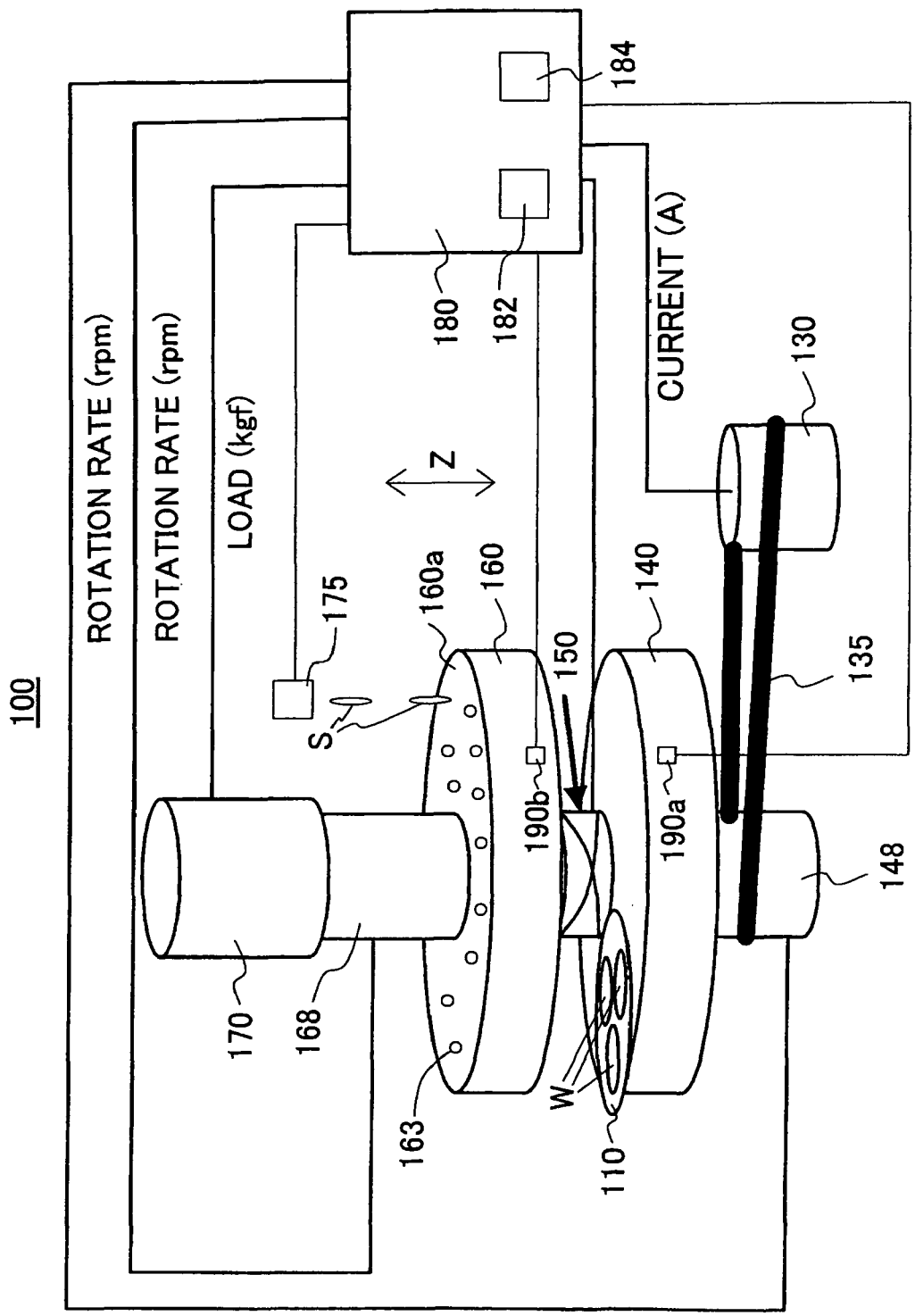
FIG. 1 is a schematic block diagram of a polishing apparatus according to one embodiment of the present invention.

Referring now to the accompanying drawings, a description will be given of a polishing apparatus 100 according to one embodiment of the present invention. FIG. 1 is a schematic perspective view of a polishing apparatus 100. The polishing apparatus 100 is configured to chemically and mechanically polish both surfaces of a work W simultaneously, but the polishing apparatus of the present invention is applicable to any polishing apparatuses in addition to the CMP apparatus, such as a polishing apparatus for finishing.

The work W of this embodiment is a substrate that is a target to be polished. The substrate includes a glass substrate, a silicon substrate, a ceramic substrate (including a laminate substrate), and any other substrates made of a single crystal material. A typical shape of those substrates is a disk shape (a disk shape with an orientation flat if the substrate is a wafer) or a rectangular plate shape. Usually, the substrate has a diameter or length of about dozens of millimeters to 300 millimeters. A thickness of the substrate typically ranges from hundreds of micrometers to tens of millimeters.

A silicon substrate or quarts substrate is used for a semiconductor substrate. A silicon substrate, glass substrate, or other substrates made of non conductive materials are frequently used for the semiconductor substrate, although a MEMS substrate is also included in the semiconductor substrate. The substrate may be a glass photo-mask. A ceramic substrate includes a ceramic laminate substrate used as a wiring substrate and a magnetic head substrate (such as an AlTiC substrate). Another wiring substrate is a laminate resin substrate. An aluminum substrate and a glass substrate may be used as a magnetic recording medium substrate. A single crystal substrate, such as lithium tantalite or lithium niobate, may be used as a gyro device, an acceleration device, a surface acoustic wave ("SAW") device, or an optical crystal material.

The polishing apparatus 100 includes a carrier 110, a fixing member, a motor (a driving unit) 130, a lower stool 140, a tachogenerator (a detecting unit) 148, a gearbox (a transfer mechanism) 150, an outer gear 158 (shown in FIG. 16), an upper stool 160, a tachogenerator (a detecting unit) 168, a cylinder (a pressurizing unit) 170, a slurry supply unit 175, and a control unit 180.

Figure 2:
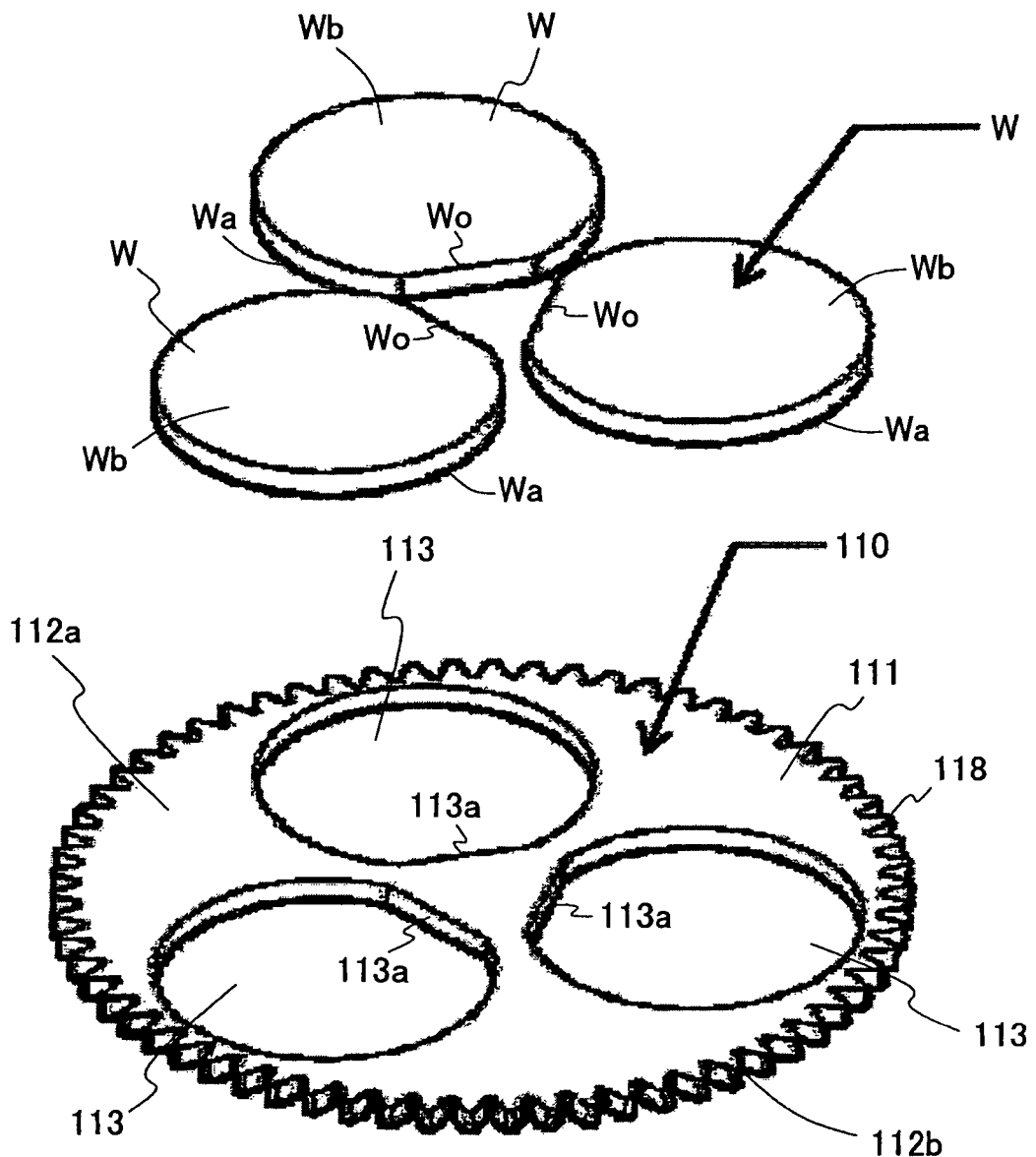
FIG. 2 is an exploded perspective view of a carrier and works mounted on the polishing apparatus shown in FIG. 1.

FIG. 2 is a schematic perspective view of the carrier 110 configured to house three works W. The work W shown in FIG. 2 is a semiconductor substrate and has an orientation flat Wo. The carrier 110 has a base 111 made of stainless steel ("SUS"). The base 111 has a disk shape, and includes a top surface 112a, a bottom surface 112b, three holes 113, and gear teeth (cogs) 118 that are provided on an outer circumferential surface and enable the carrier 110 to serve as a planetary gear.

The polishing apparatus 100 is mounted with one carrier 110 in FIG. 1, but the present invention does not limit the number of carriers 110 to be mounted on the polishing apparatus 100. When the polishing apparatus 100 is mounted with a plurality of carriers 110, they are mounted at regular angular intervals. Although this embodiment mounts four carriers 110, each figure shows only part of them for convenience.

The top surface 112a and the bottom surface 112b oppose to corresponding pad surfaces 162a and 142a (polishing surfaces) of pads 162 and 142, which will be described later. A bottom surface Wa of the work W projects from the bottom surface 112b, and a top surface Wb of the work W projects from the top surface 112a. The respective projection amounts are identical.

The hole 113 is a through-hole configured to house the work W. The hole 113 exposes the work W from both sides of the carrier 110 (or both a top surface 112a side and a bottom surface 112b side). This embodiment arranges three holes in rotational symmetry at 120° intervals, although the number of holes 113 is not limited. The hole 113 penetrates the top surface 112a and the bottom surface 112b. Each hole 113 has an approximately disk shape with a plane part 113a corresponding to the orientation flat Wo. In this embodiment, a concept of the hole 113 includes a space connected with a space configured to house the work W.

The polishing apparatus 100 has a variety of configurations so as to protect the work W against damages due to dusts or fine particles. The first protection measure is a dust generation preventive means. The second protection measure is a means for protecting the work W against the generated dusts. The polishing apparatus 100 includes the fixing member as a means for preventing vibrations of the work W in the hole 113 in the base 111 and collisions between the work W and the carrier 110. The fixing member serves to contact and fix the work W. The fixing member is placed in the hole 113 in the carrier 110.

Figure 3:
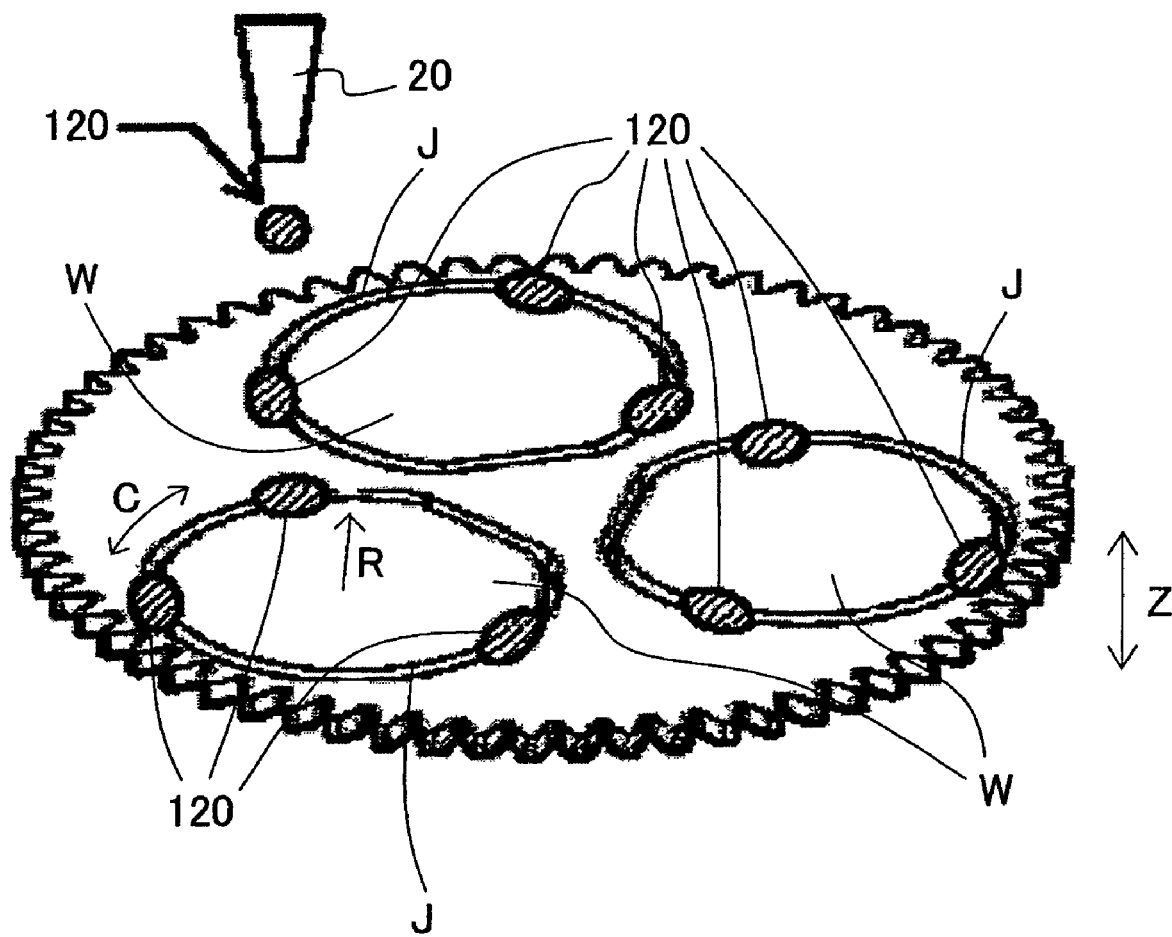
FIG. 3 is a schematic perspective view which shows adhesives which bond the works in holes in the carrier shown in FIG. 2.

FIG. 3 is a schematic perspective view of an embodiment where the fixing member is an adhesive 120 in the carrier 110 shown in FIG. 2. The adhesive 120 of this embodiment is alcowax®. The adhesive 120 bonds the carrier 110 and the work W together in the hole 113. When the centers of the work W and the hole 113 are located at the same position, a clearance J with a constant width can be created around the work W when the work W is housed in the hole 113.

The fixing member is not necessarily limited to the adhesive 120, but may be an elastic member that applies an elastic force to the work W.

Figures 4A, 4B:
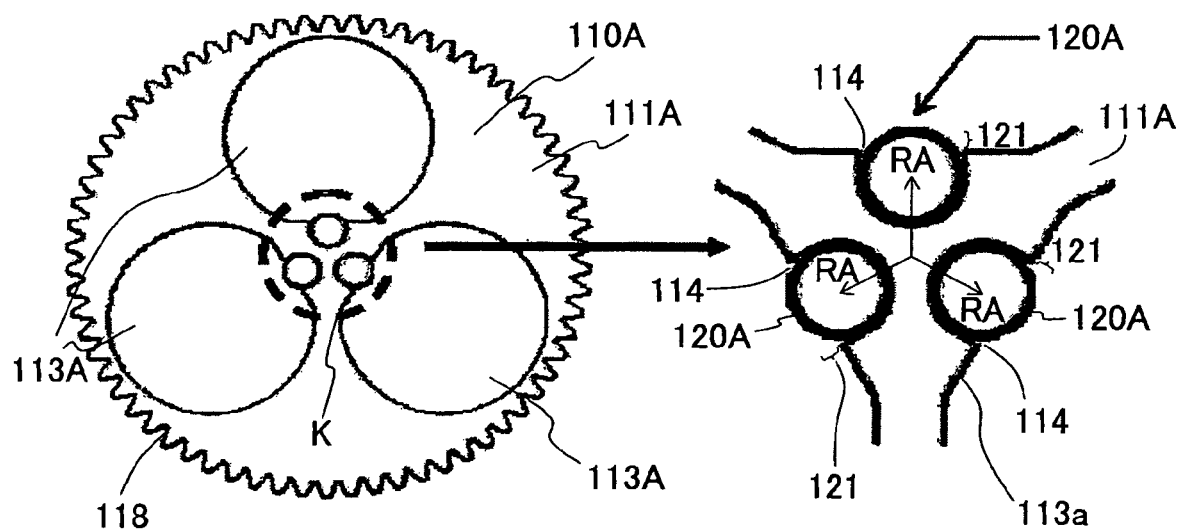
FIGS. 4A and 4B are schematic plane views of wire rings which serve to fix the works in the holes as a variation of the carrier shown in FIG. 2.

FIG. 4A is a plan view of the carrier 111A as a variation of the carrier 110. FIG. 4B is a partially enlarged view of "K" part enclosed by a dashed line in FIG. 4A. As shown in FIGS. 4A and 4B, each hole 113A corresponds to the hole 113 shown in FIG. 2 connected to a concave 114. In FIGS. 4A and 4B, the elastic member is a wire ring 120A that is engaged with or partially inserted into the concave 114.

The carrier 110A has a base 111A and holes 113A. In this embodiment, each hole 113A is connected to one concave 114, into which one wire ring 120A is inserted, but each hole 113A may be connected to a plurality of concaves, into each of which the wire ring is inserted. Thus, the number of wire rings 120A is not limited to one. When viewed from the top, each wire ring 120A has an annular shape but its shape is not limited, such as an elliptical shape. In a direction perpendicular to the paper plane, each wire ring 120A is as thick as or slightly thinner than the carrier 110A.

Each concave 114 is formed at the center of each plane part 113a opposite to the orientation flat Wo of each work W. Each concave 114 has an approximately cylindrical space that prevents a separation of each wire ring 120A from the concave 114. A position or dimension of the concave 114 is not limited.

Each wire ring 120A projects to the outside from each concave 114. A projection 121 of the wire ring 120A from the plane part 113a is located in the clearance J between the base 111A of the carrier 110A and the work W, contacts the work W, and compresses the work W in a radial direction RA to the outside.

As a result, the projection 121 of the wire ring 120A applies an elastic force to the work W in the radial direction RA, and compresses the end opposite to the orientation flat Wo of the work W in the radial direction RA against the carrier 110A, fixing the work W in the hole 113A. This embodiment fixes the work W as result of that one end of the work W contacts the wire ring 120A and the other end of the work W contacts the carrier 110A. The work W may be fixed only by plural wire rings 120A that are symmetrically arranged.

Figure 5:
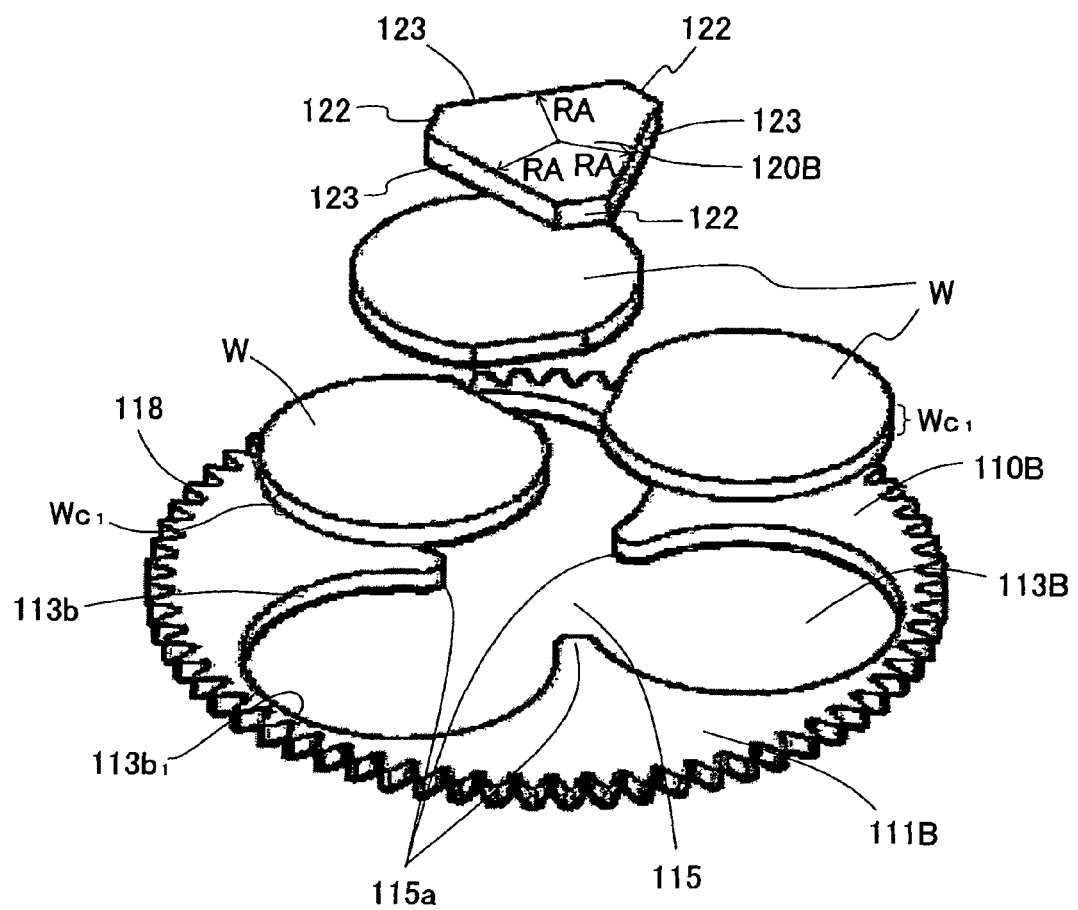
FIG. 5 is a schematic exploded perspective view which shows a forcing member which serves to fix the works in the holes as a variation of the carrier shown in FIG. 2.

FIG. 5 is an exploded perspective view of carrier 110B as a variation of the carrier 110, the works W, and an elastic member 120B as another variation of the fixing member. As shown in FIG. 5, the elastic member 120B is used commonly to the holes 113B.

A base 111B of the carrier 110B has one hole 113B. The hole 113B in FIG. 5 has a shape in which three circles partially intersect with each other. The elastic member 120B is placed in the intersecting portion (hereinafter referred as "a merging section 115") among the three circles. The elastic member 120B is thus placed in the hole 113B in this manner.

The elastic member 120B has a thin triangle pole shape in which each apex is truncated and put in the merging section 115 at the center of the carrier 110B. In a direction perpendicular to the paper plane, the elastic member 120B is as thick as or slightly thinner than the carrier 110B.

In the merging section 115, three convexes 115a of the carrier 110B project towards the inside, and each convex contacts and presses a corresponding one of truncated surfaces 122 of the elastic member 120B. The elastic member 120B is made of an elastic material, such as rubber, and contacts and presses three orientation flats Wo of the three works W via three pressing parts 123. Each pressing part 123 is a planer part which surface-contacts and is parallel to each orientation flat Wo of the work W, and corresponds to the plane part 113a shown in FIG. 2. However, the pressing part 123 extends to the outside in the radial direction longer than the plane part 113a shown in FIG. 2 so as to fill the clearance J. The projection amount is set to be slightly larger than the width of the clearance J.

As a result, the pressing part 123 of the elastic member 120B forces the work W in the radial direction to the outside, and the carrier 110B presses an end $Wc_1$ opposite to the orientation flat Wo of the work W along the radial direction RA. Thereby, the work W is fixed in the hole 113B. This embodiment fixes the work W as a result of that one end of the work W (or the orientation flat Wo) contacts the elastic member 120B and the other end (or the end $Wc_1$) of the work W contacts a part $113b_1$ of a contour surface 113b that defines the hole 113 in the carrier 110B. Alternatively, instead of making the work W contact the carrier 110B, another elastic member may be located at the position of the part $113b_1$ of the carrier 110 and project towards the inside so as to fill the clearance J. Thereby, the other elastic member contacts and compresses the end $Wc_1$ that is opposite to the orientation flat Wo of the work W in the radial direction RA, and the work W does not contact the carrier 110B.

In the above embodiment, the fixing member contacts and fixes the work W in the hole 113. The fixing member prevents vibrations of the work W in the hole 113. Suppose that a height direction of the carrier 110 is a Z direction, and a plane perpendicular to the Z direction is a XY plane, the work W in the hole 113 can vibrate on the XY plane. When the work W does not vibrate, it does not collide with the carrier 110 or generate dusts.

In another embodiment, the polishing apparatus 100 provides an elastic member between the work W in the hole 113 and the carrier 110, and the work W may or may not vibrate in the hole 113. This is because the elastic member protects the work W against a collision with the carrier 110 even when the work W oscillates or moves in the hole 113.

When the elastic member is as wide as the clearance J between the work W and the carrier 110, no force is applied to the work W in the initial state. However, the elastic member fills the clearance J and fixes the work W in the hole 113. The elastic member applies a force to the work W, once the work W displaces in any directions due to a frictional force with the polishing surface. Since the works W does not contact the carrier 110 due to the elastic member, no work's ends chip and no dusts occur.

When the elastic member is thicker than the clearance J between the work W and the carrier 110, the force is applied to the work W in the initial state when the elastic member is provided onto the hole 113 and the fixing force of the work W increases in the hole 113. Since the work W does not contact the carrier 110 by the elastic member, no work's ends chip and no dusts occur. For example, a rubber band thicker than the clearance J may be would around the work W and the work W may be inserted into the hole 113.

When the elastic member is thinner than the clearance J between the works W and the carrier 110, no force is applied to the work W in the initial state and the clearance J allows a movement of the work W in the hole 113. However, since the work W does not contact the carrier 110 even when the work W moves, no work's ends chip and no dusts occur.

Figure 6:
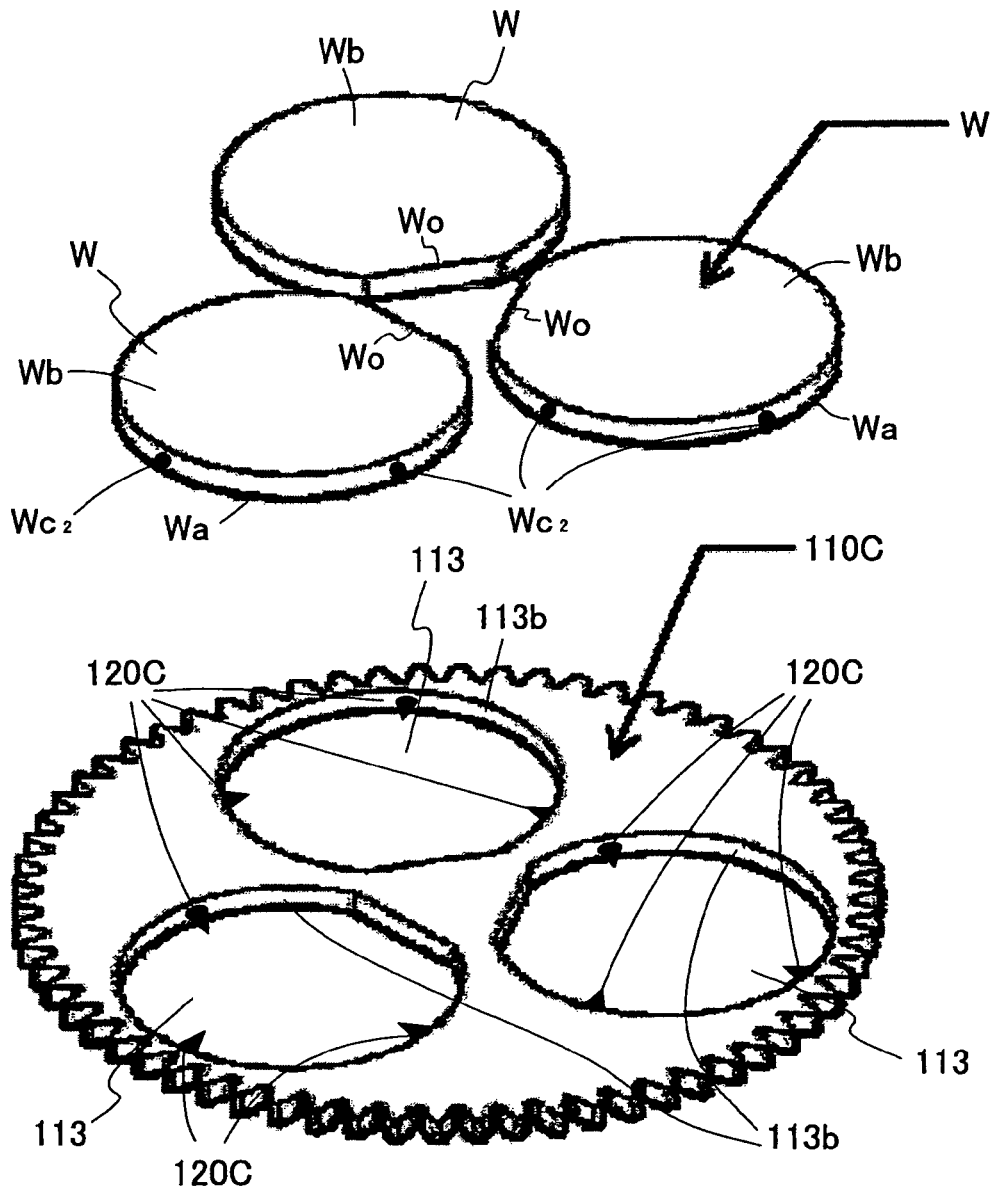
FIG. 6 is a schematic exploded perspective view which shows elastic members which serve to fix the works in the holes of the carrier shown in FIG. 2.

FIG. 6 is an exploded perspective view showing that elastic members 120c are fixed on part of a contour surface 113b of the carrier 110C that defines the hole 113 in the carrier 110C. The elastic members 120C, for example, each have an approximately cylindrical shape, and are arranged at 120° intervals at three positions on the contour surface 113B and fixed onto the contour surfaces 113B. The fixation may be bonding, or engaging by forming a concave similar to the concave 114 shown in FIG. 4 and by inserting the elastic member into the concave.

As long as the hole 113 can house the work W, the shape and size of the elastic member and the number of elastic members are not limited. The elastic member 120C may be integrated with the carrier 110. For example, the elastic members 120C may each have a triangular or quadrangular prismatic shape, and be arranged at predetermined intervals. Alternatively, the elastic member 120C may have a thin-walled hollow cylindrical shape. This embodiment makes the elastic member 120C when the elastic member is viewed from the Z direction, shorter than the clearance J shown in FIG. 3.

Figure 23A:
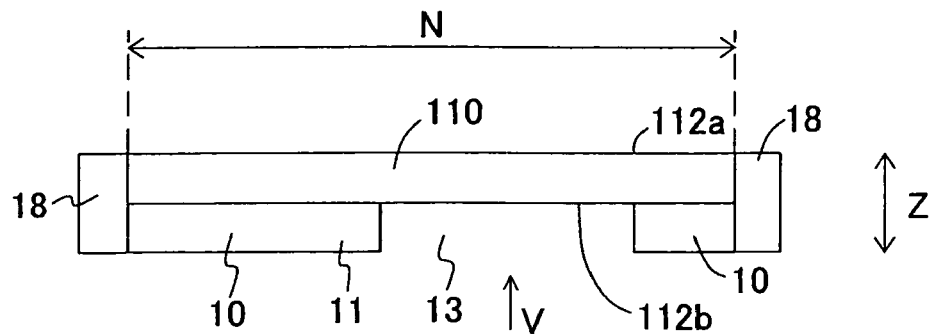
FIGS. 23A-23D are schematic sectional views showing states of each step shown in FIG. 22.
Figure 23B:
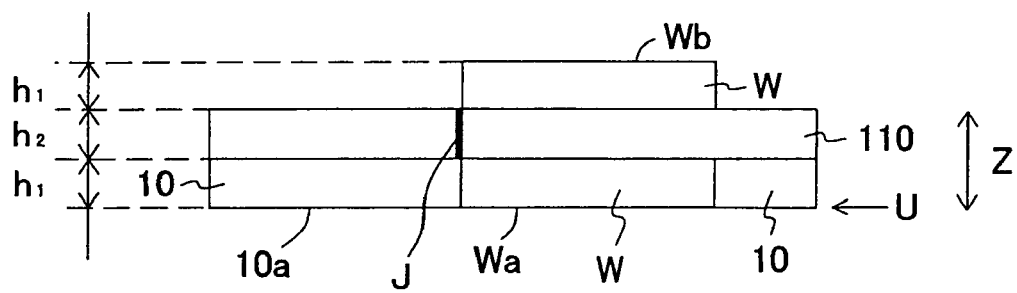
Figure 23C:
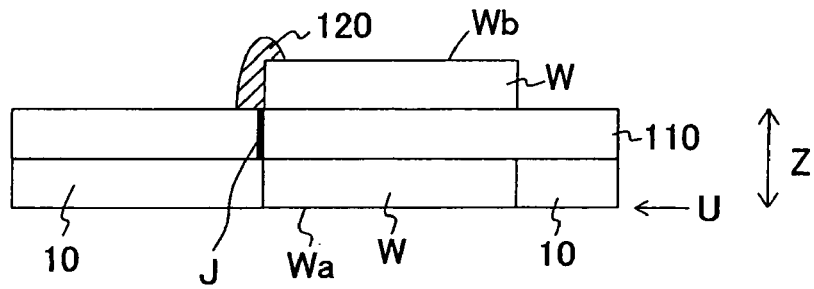
Figure 23D:
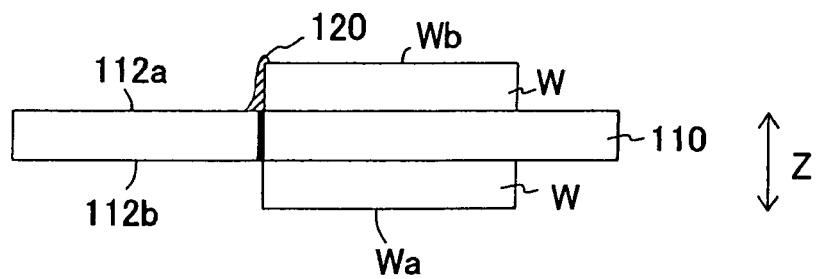
Figure 24:
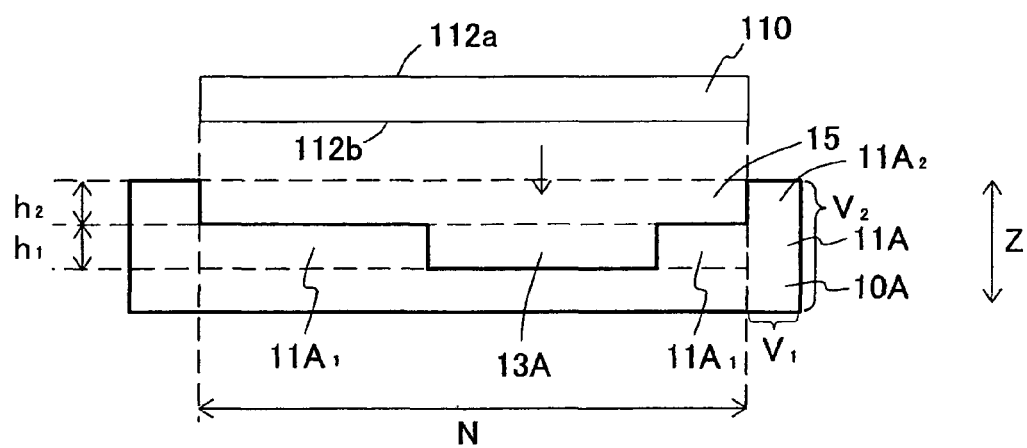
FIG. 24 is a schematic sectional view that shows a variation of the spacer shown in FIG. 23.

This approach does not fix the work W to the carrier 110 and may not be able to maintain a positional relationship shown in FIG. 23D which follows. For example, one solution for this problem is to provide three holes $Wc_2$ that extend in the radial directions in the outer circumferential side surface Wc of the work W, and to insert three conically-shaped elastic members into the three holes $Wc_2$. As a result, the work W receives no force when the work W is placed in the hole 113 and the clearance J having a constant width can be formed around the work W, but once the work W moves to any direction the outer circumferential side surface Wc of the work W contacts the conical side wall of the elastic member 120C.

Figure 7:
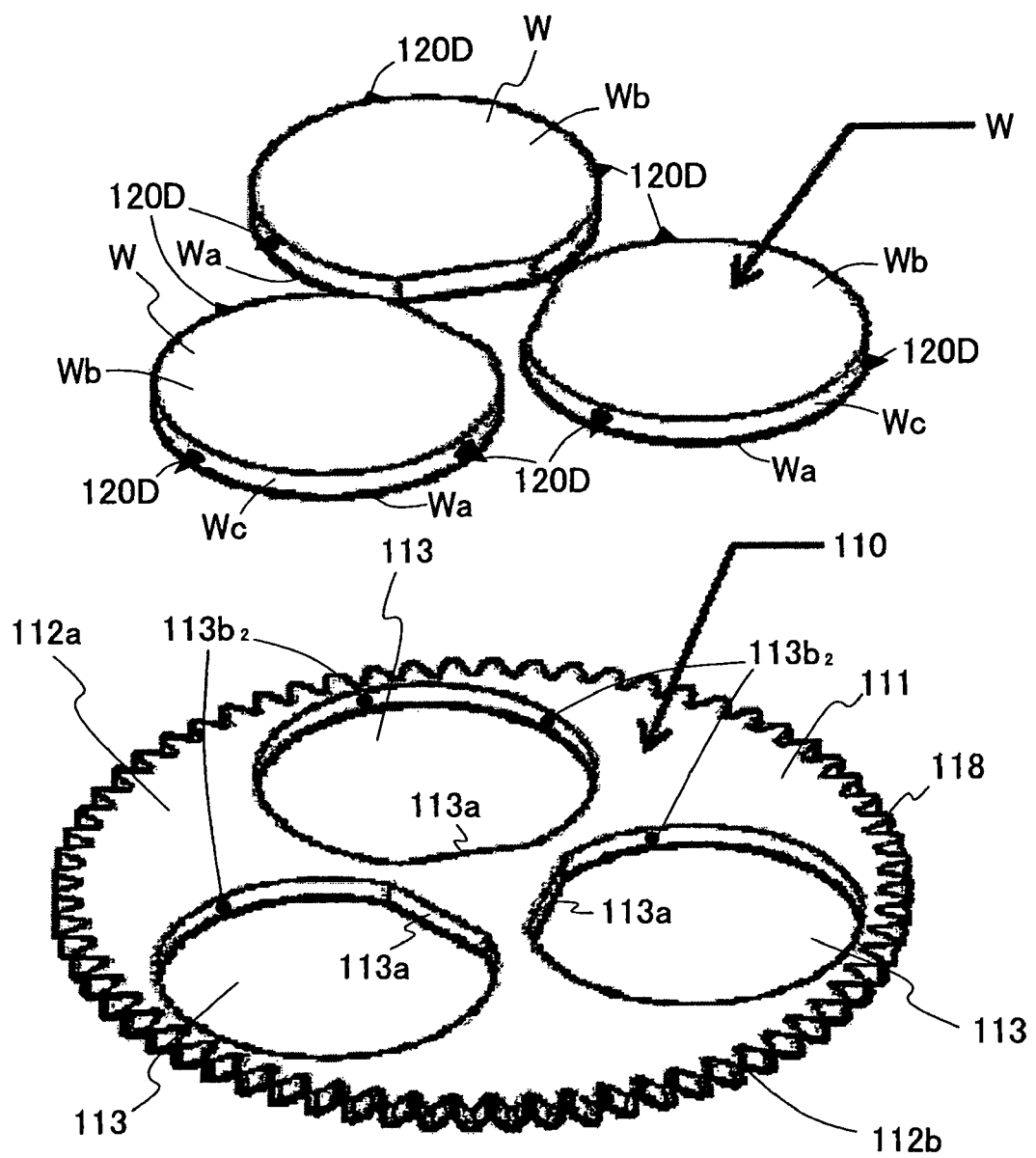
FIG. 7 is a schematic perspective view which shows other elastic members which serve to fix the works in the holes of the carrier shown in FIG. 2.

FIG. 7 is an exploded perspective view of the works W and the carrier 110. The elastic members 120D on at least part of the outer circumferential side surface Wc are fixed on each work W. The elastic members 120D, for example, each have a cylindrical shape, and may be arranged at 120° intervals at three positions on the outer circumferential side surface Wc of the work W. The fixation may use bonding, or elastic forces. In comparison with FIG. 6, FIG. 7 reverses the positional relationship between elastic members and concaves between the work W and the carrier 110. Each elastic member 120D is inserted into each hole $113b_2$ in the contour surface 113b of the carrier 110.

Dusts may be removed once they occur from both surfaces Wa and Wb of the work W. The following embodiment utilizes a pattern of a convex and a concave (a convexo-concave pattern) formed on at least one of both surfaces 112a and 112b of the carrier 110 to remove dusts that occur during polishing, from between the carrier 110 and the polishing surface as quickly as possible. A description will now be given of the embodiment that forms the convexo-concave pattern as grooves.

Figure 8:
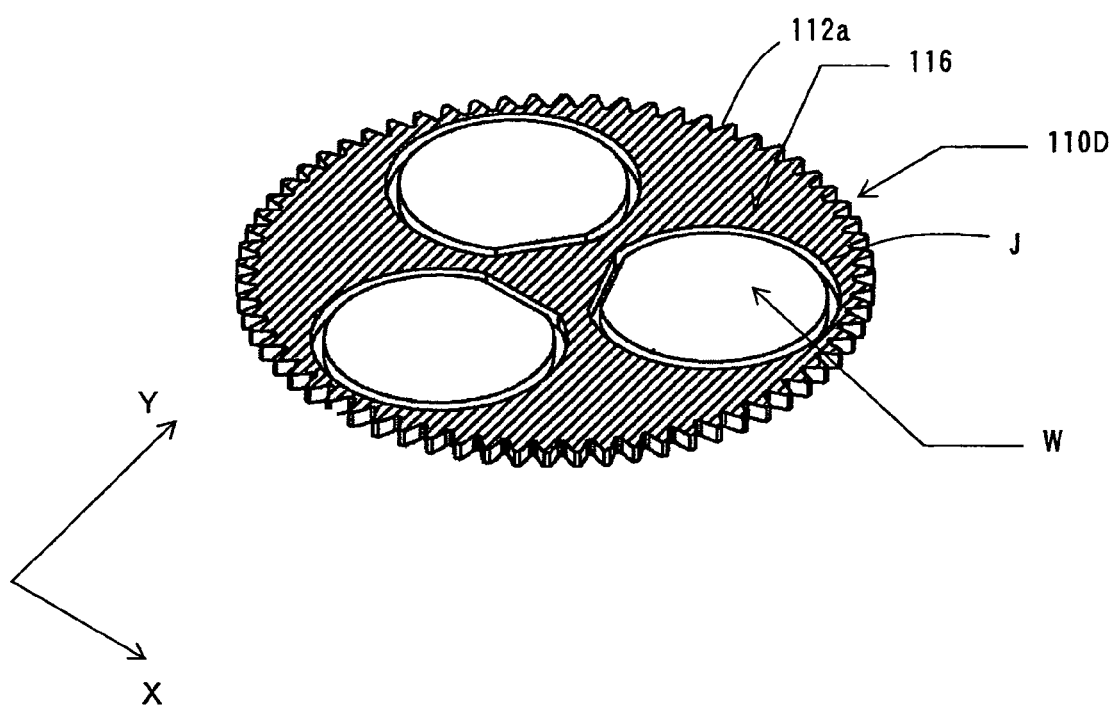
FIG. 8 is a schematic perspective view which shows illustrative grooves which may be formed on the carrier shown in FIG. 2.

FIG. 8 is a perspective view of a carrier 110D that houses works W. The top surface 112a of the carrier 110D has a plurality of grooves 116 configured to remove dusts. Except for the grooves 116, the carrier 110D is identical to the carrier 110 shown in FIG. 2. FIG. 8 omits the adhesives 120 shown in FIG. 3. All of the grooves 116 extend in parallel in a single direction (parallel to the Y direction).

Figure 9:
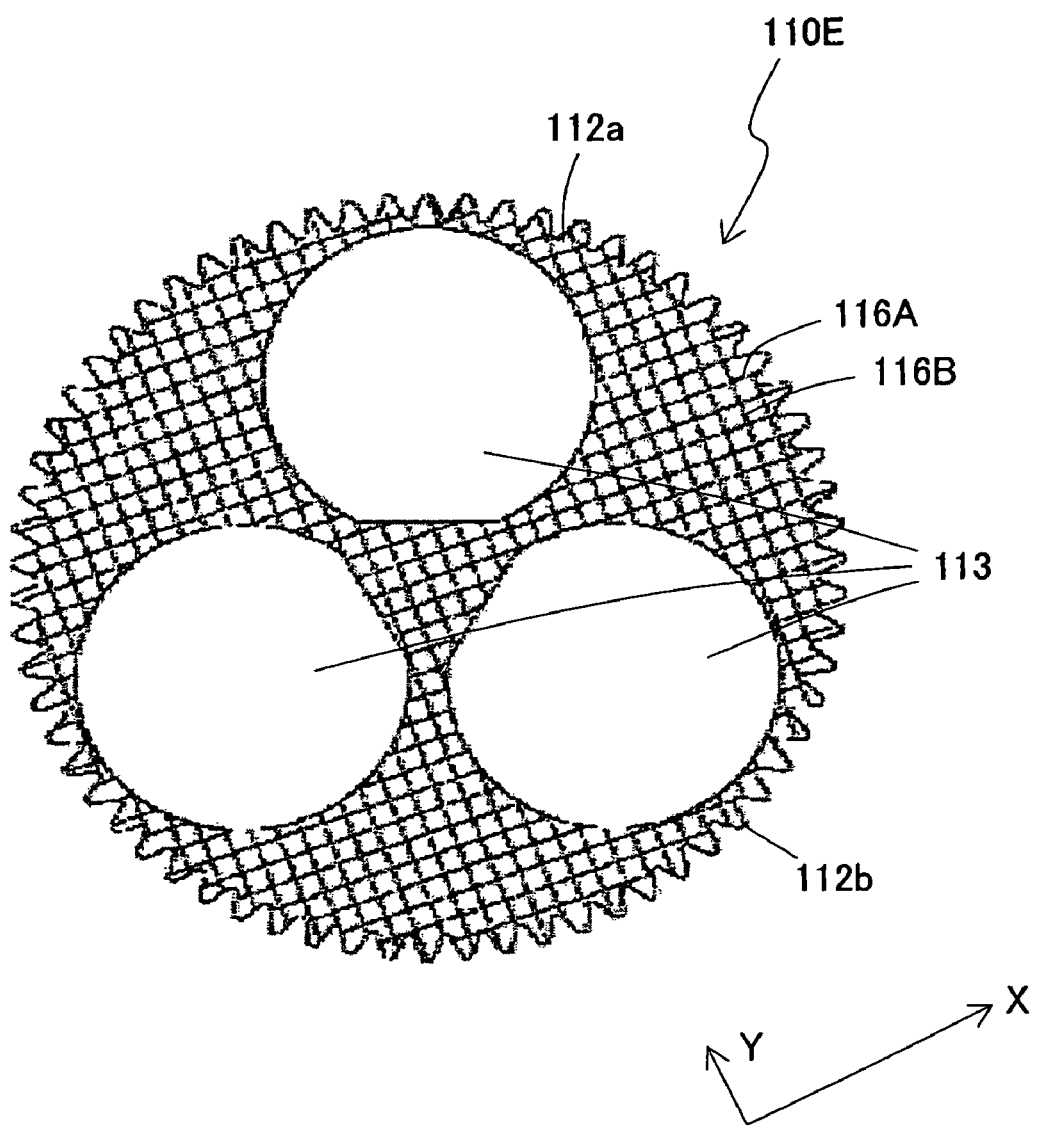
FIG. 9 is a schematic perspective view which shows other illustrative grooves which may be formed on the carrier shown in FIG. 2.

FIG. 9 is a plan view of the carrier 110E. The top surface 112a of the carrier 110E has a plurality of grooves 116A and 116B configured to remove dusts. Except for the grooves 116A and 116B, the carrier 110E is identical to the carrier 110 shown in FIG. 2. All of the grooves 116A extend in parallel in a single direction (parallel to the X direction), and all of the grooves 116B also extend in parallel in a single direction (parallel to the Y direction). The X direction and the Y direction are orthogonal to each other. The grooves 116A and 116B may have the same shape but may have different shapes.

Figure 10:
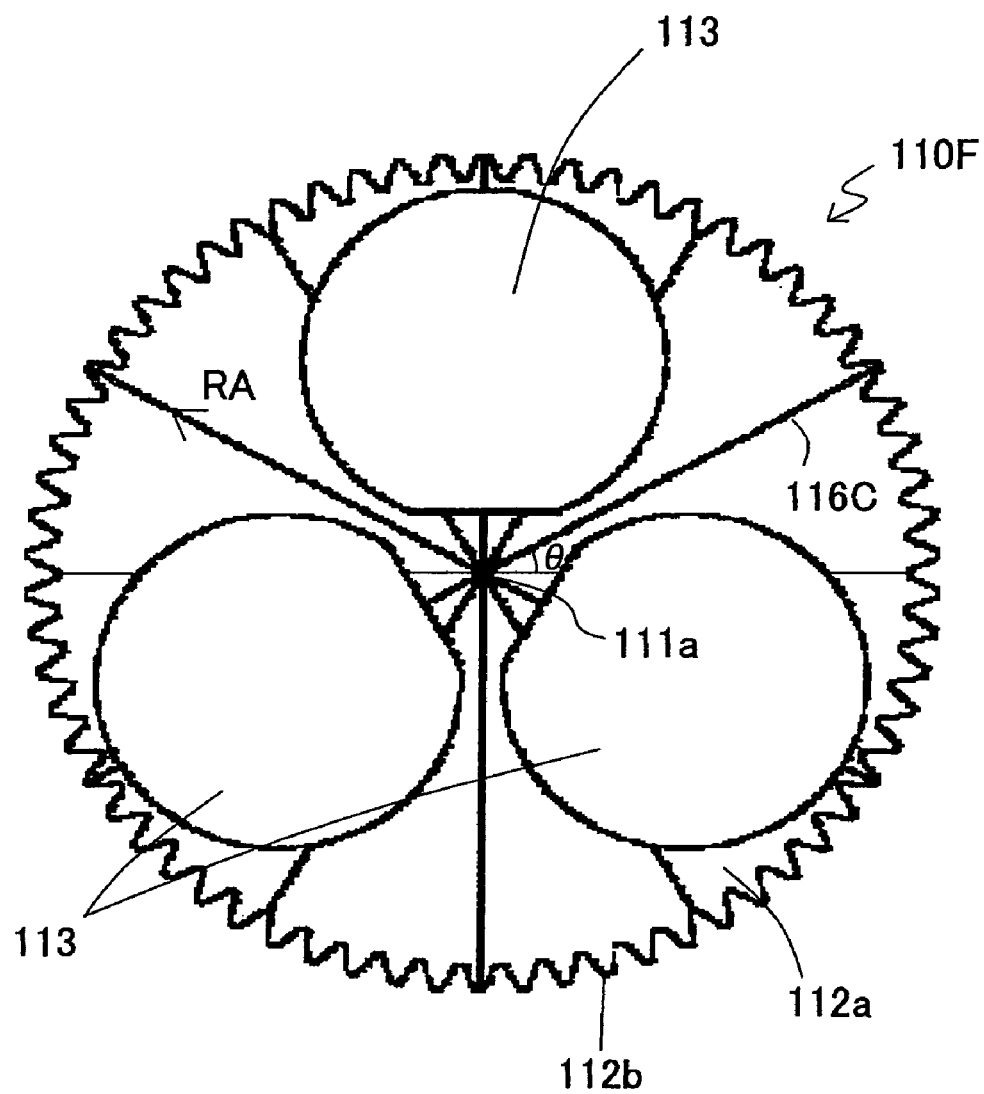
FIG. 10 is a schematic perspective view which shows yet illustrative grooves which may be formed on the carrier shown in FIG. 2.

FIG. 10 is a plan view of a carrier 100F. The top surface 112a of the carrier 110F has a plurality of grooves 116C configured to remove dusts. Expect for the grooves 116C, the carrier 110F is identical to the carrier 110 shown in FIG. 2. A plurality of grooves 116C extend from the center 111a of the carrier 111 in radial directions RA at regular angular intervals of θ=30°. The angular interval of the grooves 116C is not necessarily limited to 30°, and the grooves 116C may not be distributed around the center 111a at regular angular intervals. Additionally, the center from which the grooves 116C extends may shift from the center of the carrier 110F.

Figure 11:
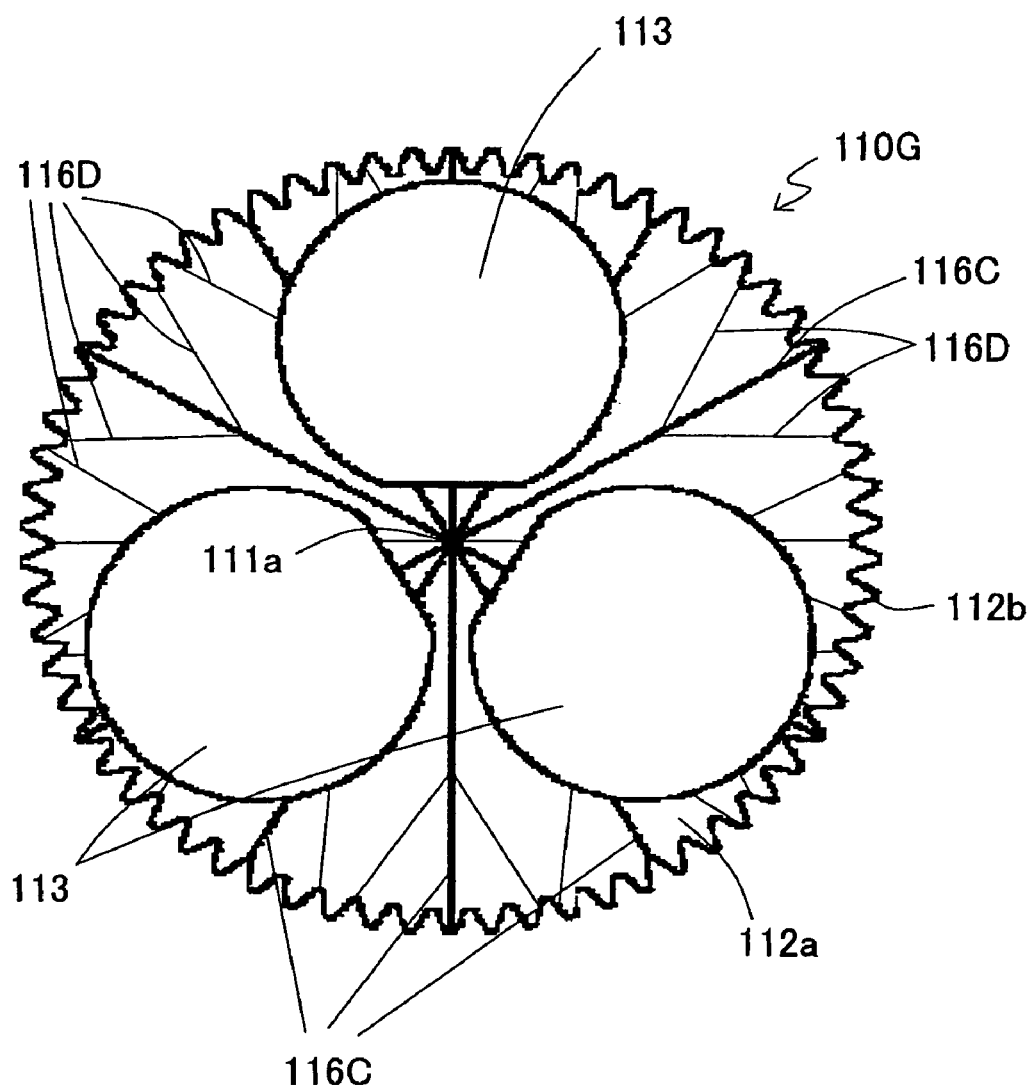
FIG. 11 is a schematic perspective view which shows a variation of those in FIG. 10.

FIG. 11 is a plan view of a carrier 110G. The top surface 112a of the carrier 110G has a plurality of grooves 116C and 116D configured to remove dusts. Except for the grooves 116C and 116D, the carrier 110G is identical to the carrier 110 shown in FIG. 2. A pair of the grooves 116D diverge from the same position on the groove 116C apart from the center 111a of the carrier 110. The diverging direction is not limited, but the groove 116D is parallel to the adjacent groove 116C at the diverging side in FIG. 11. The number of diverging points is not limited to one, and the diverged groove may further be diverged.

As described above, the linear grooves may extend in one or two directions on the orthogonal coordinate system. The grooves may also extend in a radial direction from the center 111a of the carrier 110 or from any other positions at regular or irregular angular intervals on the polar coordinate system, or branch on its way.

Figure 12:
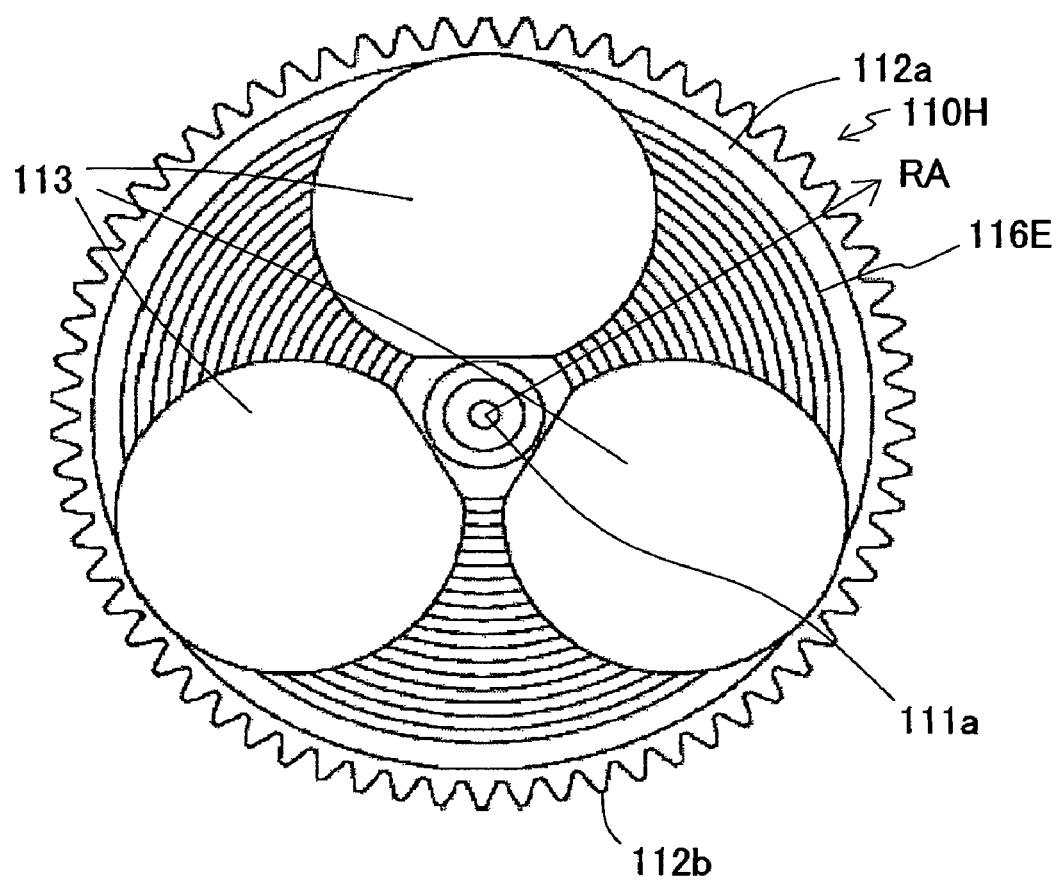
FIG. 12 is a schematic perspective view which shows other illustrative grooves which may be formed on the carrier shown in FIG. 2.

FIG. 12 is a plan view of a carrier 110H. The top surface 112a of the carrier 110H has a plurality of grooves 116E configured to remove dusts. Except for the grooves 116E, the carrier 110H is identical to the carrier 110 shown in FIG. 2. A plurality of grooves 116E concentrically extends around the center 111a of the carrier 110H with respect to the radial direction RA at regular intervals. The interval between the concentric circles is not necessarily regular, and the respective concentric circles may have different dimensions.

Figure 13:
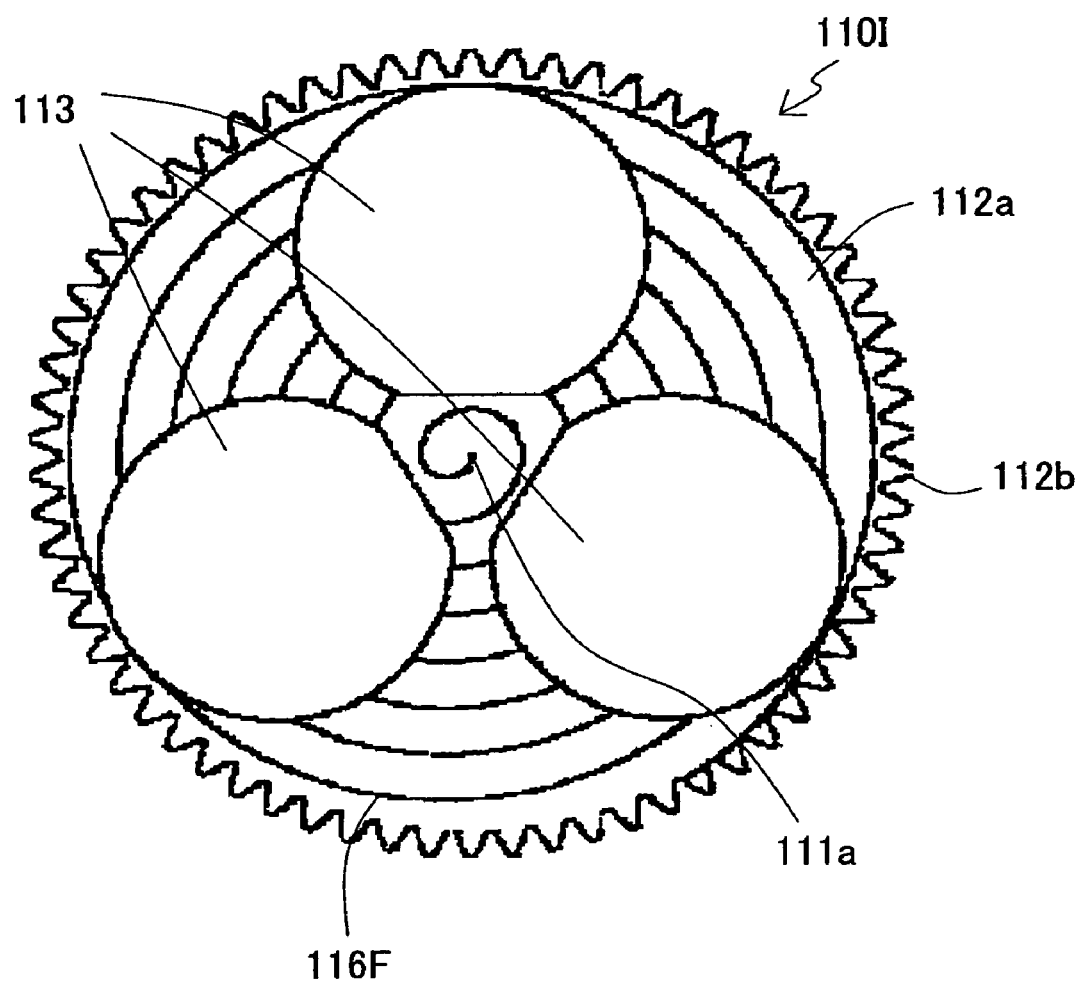
FIG. 13 is a schematic perspective view which shows another illustrative groove which may be formed on the carrier shown in FIG. 2.

FIG. 13 is a plan view of a carrier 110I. The top surface 112a of the carrier 110I has a groove 116F configured to remove dusts. Except for the groove 116F, the carrier 110I is identical to the carrier 110 shown in FIG. 2. The groove 116F spirally extends from the center 111a of the carrier 110I. The spiral extends clockwise in this embodiment but may extend counterclockwise.

Figure 14:
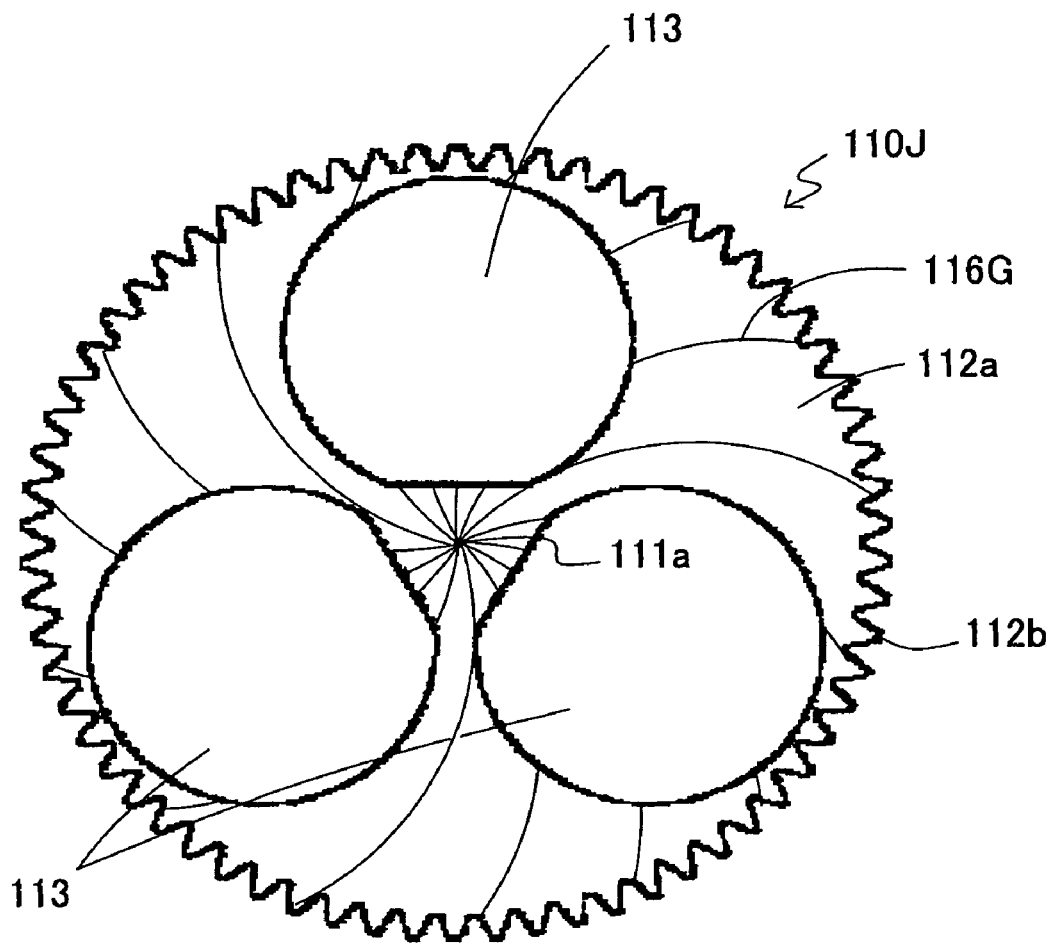
FIG. 14 is a schematic perspective view which shows other illustrative grooves which may be formed on the carrier shown in FIG. 2.

FIG. 14 is a plan view of a carrier 110J. The top surface 112a of the carrier 110J has a plurality of grooves 116G configured to remove dusts. Except for the grooves 116G, the carrier 110J is identical to the carrier 110 shown in FIG. 2. A plurality of the grooves 116G vertically extends from the center 111a of the carrier 110J. The vortex extends clockwise in this embodiment but may also extend counterclockwise. The interval of the vortex may be constant or may not be constant.

As described above, the curved groove may extend concentrically, spirally, or vertically. The grooves may also extend in any curved line, such as a quadratic curve, elliptic curve, or any other curves.

Figure 15:
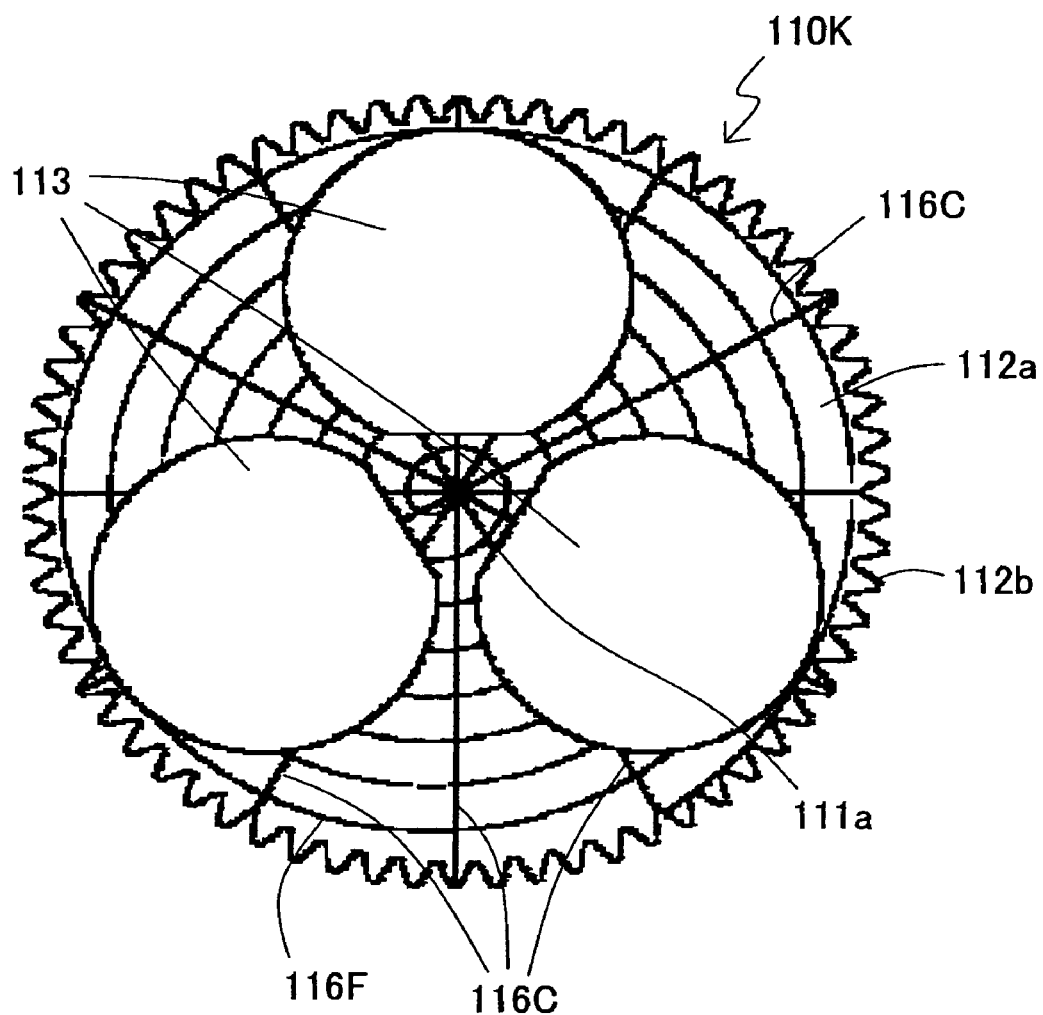
FIG. 15 is a schematic perspective view of the carrier which has the grooves shown in FIG. 10 and FIG. 13.

FIG. 15 is a plan view of a carrier 110K. The top surface 112a of the carrier 110K has a plurality of grooves 116C and 116F configured to remove dusts. As described above, the grooves 116 to 116G in FIGS. 8 to 15 may be arbitrarily combined.

Each of the grooves 116 to 116G has a width and depth of several tens of μm, and forms an isosceles triangular section. Thus, each of the grooves 116 to 116G has a V-shaped section but its sectional shape is not limited. While this embodiment forms the grooves 116 to 116G on the top surface 112a of each of the carriers 110D-110K in the gravity direction, the bottom surface 112b of the carriers 110D to 110K may also have these grooves additionally or exclusively.

Figure 16:
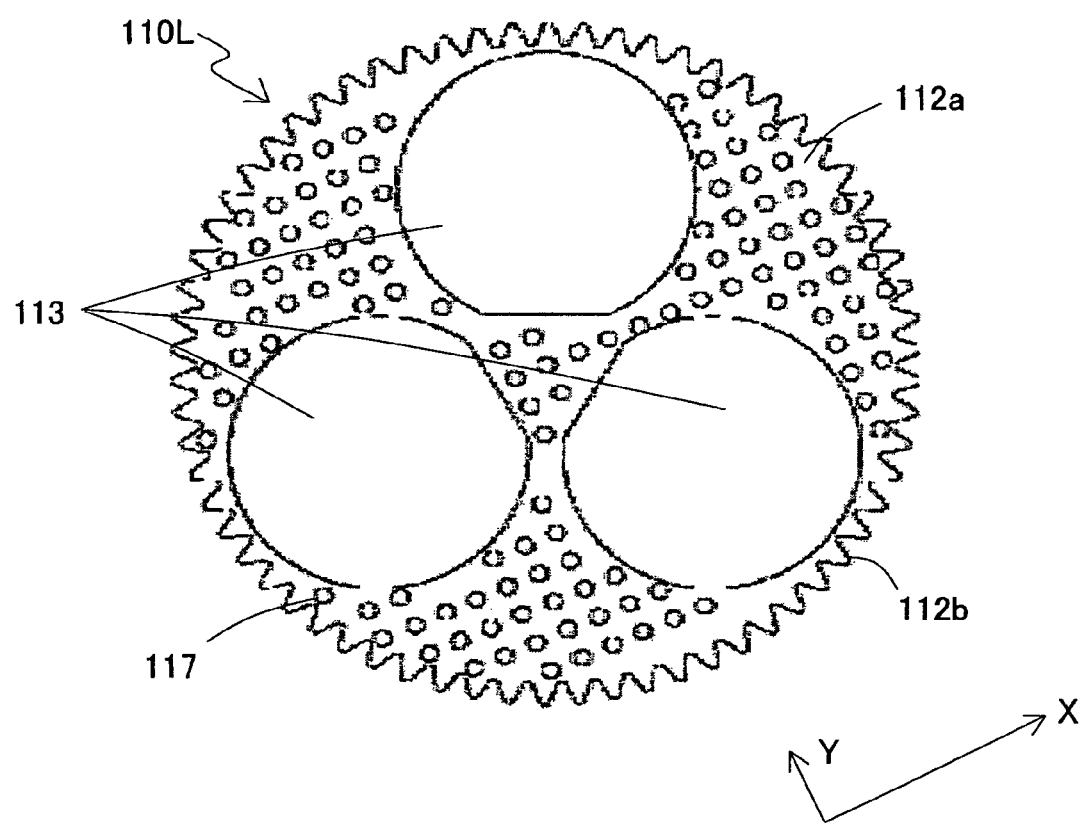
FIG. 16 is a schematic perspective view which shows illustrative through-holes which may be formed on the carrier shown in FIG. 2.

The convexo-concave pattern formed at least one of both surfaces 112a and 112b of the carrier 110 may be the above groove or a through-hole. FIG. 16 is a plan view of a carrier 110L that has a plurality of through-holes 117 that penetrate the top surface 112a and the bottom surface 112b. The through-holes 117 are two-dimensionally arranged at regular intervals in XY directions, but may be arranged concentrically, spirally, or vertically. Each through-hole 117 has a diameter of dozens of μm. The through-hole 117 allows the dust to pass through it, and eliminates the dust.

The pattern formed at least one of both surfaces 112a and 112b of the carrier 110 may include plural projections formed on both surfaces 112a and 112b.

Turning back to FIG. 1, the motor 130 rotationally drives the lower stool 140 via a transfer mechanism 135 such as a belt or a pulley, and the tachogenerator 148. The tachogenerator 148 is provided around the rotational axis of the lower stool 140, and outputs an analog voltage corresponding to the rotation rate (the number of revolutions) of the lower stool 140 to the control unit 180.

Figure 17:
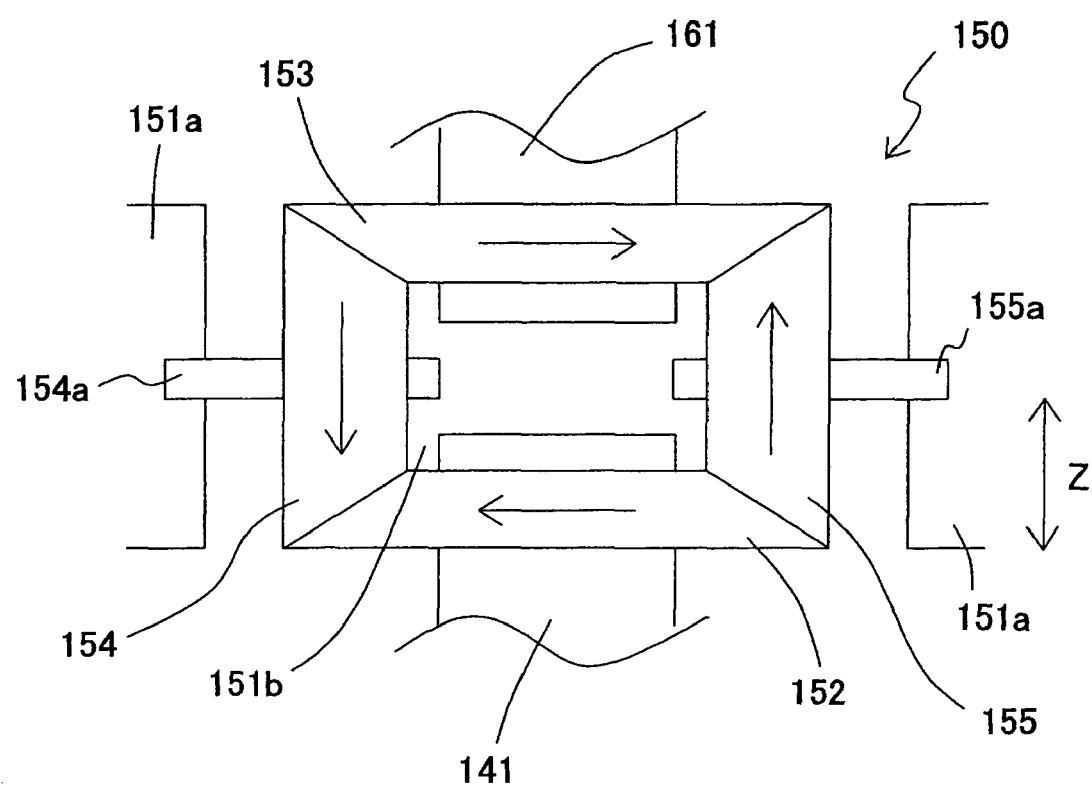
FIG. 17 is a schematic partially sectional view which shows an example of a gearbox in the polishing apparatus shown in FIG. 1.

Referring now to FIG. 17, a description will be given of a principle of the gearbox 150. FIG. 17 is a schematic sectional view of the gearbox 150. The gearbox 150 inverts a rotational direction of a shaft 141, and transfers the rotation to a shaft 161. The gearbox 150 is fixed around the shaft 141 which is a rotational axis of the lower stool 140 and is also fixed around the shaft 161 which is a rotational axis of the upper stool 160. Although the principle of the gearbox 150 is shown in FIG. 17, the structure of the gearbox 150 is not limited to that shown in FIG. 17 as long as the gearbox 150 can invert the rotation direction of the shaft 141 and transfer the rotation to the shaft 161.

The gearbox 150 has the housings 151a and 151b, a pair of bevel gears 152 and 153, and three bevel gears. FIG. 17 shows only two of the three bevel gears as designated by 154 and 155, and omits the remaining one for illustration convenience.

The housing 151b is provided in the housing 151a, and has two holes, into which the shafts 141 and 161 are inserted, and three holes, into which ends of the shafts of the three bevel gears are inserted. FIG. 17 shows the housing 151b transparently for convenience. The housing 151a possesses an annular shape when viewed from the top in the Z direction, and has holes, into which other ends of the shafts of the three bevel gears are inserted. Both ends of shafts on the three bevel gears are fixed in the housings 151a and 151b and do not rotate.

The bevel gear 152 is fixed around the shaft 141, and rotates with the shaft 141. The shaft 141 is a shaft to which a driving force by the motor 130 is transferred. The three bevel gears are engaged with the bevel gear 152 and are arranged at 120° intervals. FIG. 17 shows the bevel gear 154 and its shaft 154a, and the bevel gear 155 and its shaft 155a among the three bevel gears. As described above, the shafts 154a and 155a are fixed in the housings 151a and 151b. The bevel gear 153 is engaged with the three bevel gears, and rotates with the shaft 161 that is a rotational axis of the upper stool 160.

As the bevel gear 152 rotates clockwise when viewed from the top in Z-direction, the front side rotates to the left as shown in FIG. 17. Then, the front side of the bevel gear 154 rotates downwardly, as shown in FIG. 17. In response, the front side of the bevel gear 153 rotates to the right, as shown in FIG. 17. Similarly, the front side of the bevel gear 155 rotates upwardly, as shown in FIG. 17. In response, the front side of the bevel gear 153 rotates to the right, as shown in FIG. 17. Consequently, the bevel gears 152 and 153 rotate in opposite directions, and the driving force applied to the shaft 141 is inverted and transferred to the shaft 161.

FIG. 17 provides the same number of teeth to the three bevel gears 154 and 155 for convenience of description of the inversion. However, in an actual configuration, the three bevel gears have different number of teeth, and are configured to selectively contact the bevel gear 152. The control unit 180 can control which of the three bevel gears should contact the bevel gear 152, consequently changing a gear ratio of the gearbox 150.

As a result, the driving force of the motor 130 is transferred to the upper stool 160 via the gearbox 150, and the upper stool 160 rotates in opposite directions to that of the lower stool 140. The tachogenerator 168 is placed around the rotation axis of the upper stool 160, and outputs an analog voltage corresponding to the rotation rate of the upper stool 160 to the control unit 180.

Figure 18:
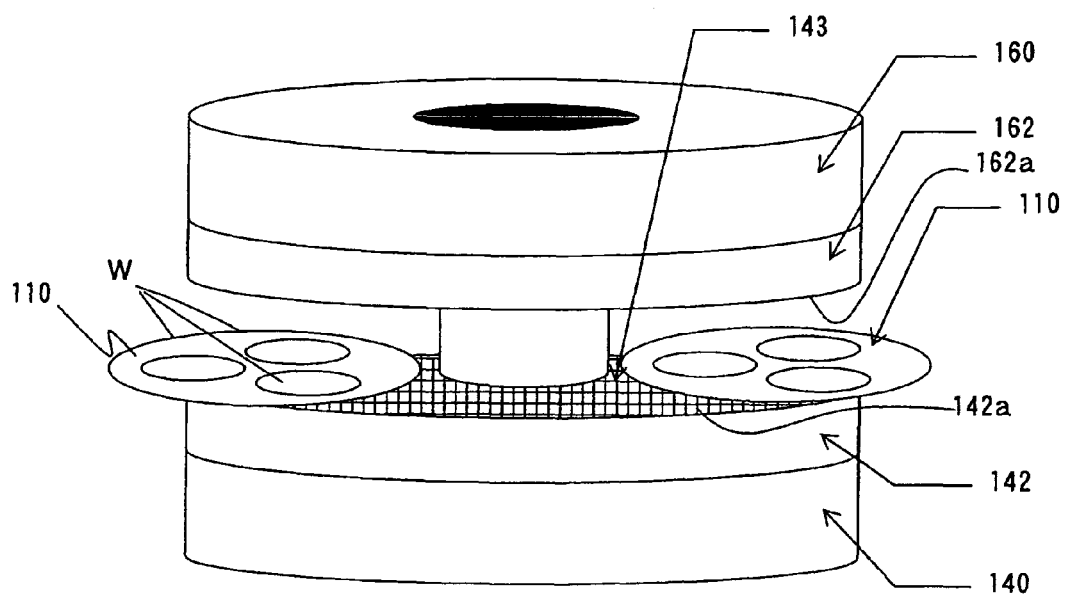
FIG. 18 is a schematic perspective view which shows illustrative a convexo-concave pattern which may be formed on the pad on a lower stool shown in FIG. 1.

As shown in FIG. 18, the lower stool 140 includes the pad 142 having a polishing surface (pad surface) 142a on the side of the carrier 110. The upper stool 160 includes the pad 162 having a polishing surface (pad surface) 162a on the side of the carrier 110.

As a means for removing dust after the dust occurs, the pad 142 has a convexo-concave pattern 143 on the pad surface 142a to remove dusts generated during polishing from between the carrier 110 and the polishing surface as quickly as possible. The convexo-concave pattern 143 may be the groove shown in FIG. 8 to FIG. 16, through-holes, or any other patterns.

The pad 142 and pad 162 are made of soft materials such as urethane, and have the same structure.

Figure 19A:
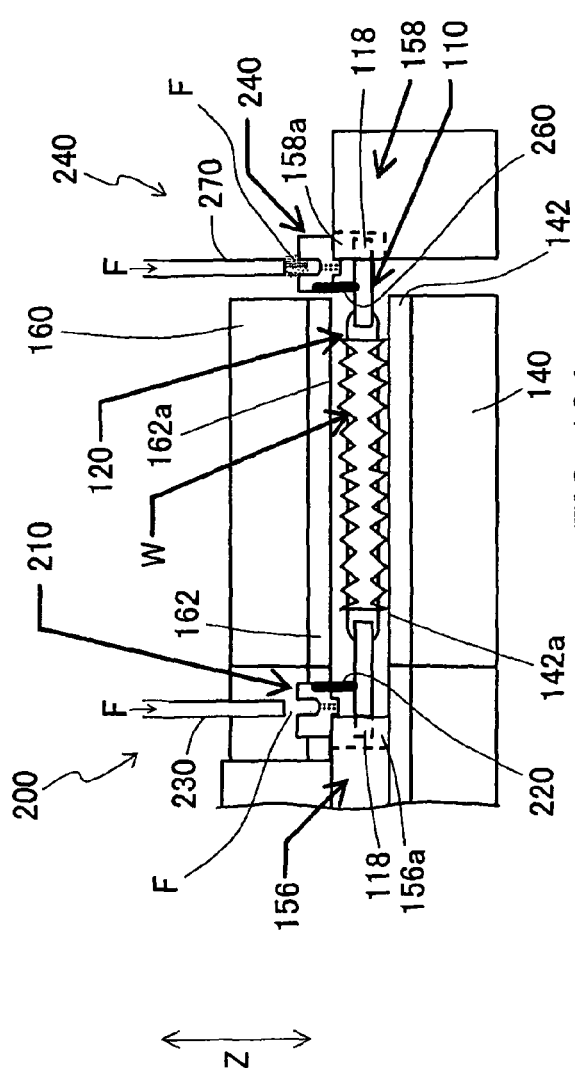
FIGS. 19A and 19B are schematic sectional and perspective views of first and second dustproof mechanisms applied to the carrier of the polishing apparatus shown in FIG. 1, a sun gear, and an outer gear.

FIG. 19A is a schematic sectional view showing a sun gear 156, the carrier 110, an outer gear 158, a first dustproof mechanism 200, and a second dustproof mechanism 240.

This embodiment provides the sun gear 156 around the shaft 141 on the lower stool 140 under the gearbox 150, and allows the sun gear 156 to rotate with the shaft 141. An alternative embodiment, however, provides the sun gear 156 around the shaft 161 on the upper stool 160 over the gearbox 150, and allows the sun gear 156 to rotate with the shaft 161. The sun gear 156 has teeth (cogs) 156a.

The carrier 110 has teeth (cogs) 118 on its outer circumference. The teeth 118 enable the carrier 110 to serve as a planetary gear. The teeth 156a of the sun gear 156 are engaged with the teeth 118 of the carrier 110. The outer gear 158 has teeth 158a, which are engaged with the teeth 118 of the carrier 110. The sun gear 156, the carrier 110 as the planetary gear, and the outer gear 158 constitute a planetary gear mechanism.

The planetary gear mechanism is a speed increasing or decreasing mechanism in which one or more planetary gears rotate and revolve around the sun gear. The planetary gear mechanism can obtain a large velocity ratio with a small number of stages, transfer a large torque, and place input and output shafts coaxially.

In the polishing apparatus 100 shown in FIG. 1, the gearbox 150 serves as the sun gear and rotates. The carrier 110 serves as the planetary gear, and rotates and revolves around the gearbox 150. The outer gear 158 is fixed.

The first dustproof mechanism 200 serves to prevent dusts that are generated from the engagements between the teeth 156a of the sun gear 156 and the teeth 118 of the carrier 110, from entering between the work W and the pad surface (polishing surface) 142a or 162a.

Figure 19B:
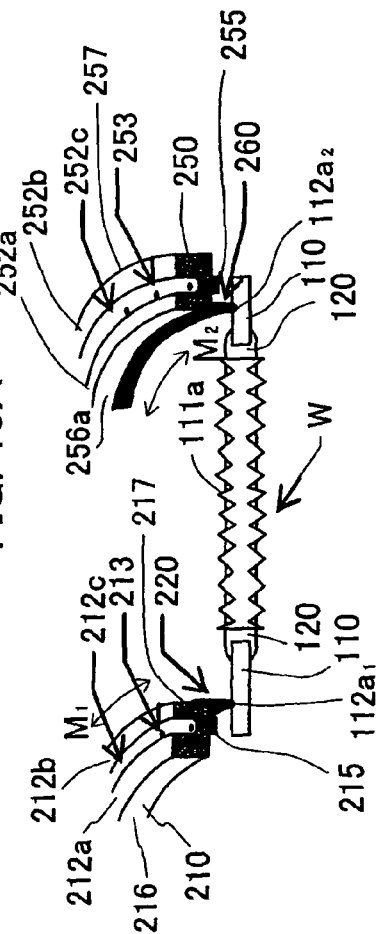

FIG. 19B is a schematic perspective view of the first dustproof mechanism 200 and the second dustproof mechanism 240.

The first dustproof mechanism 200 has a first block 210, a wiper (first elastic member) 220, and a fluid supply nozzle 230.

The first block 210 has an annular shape, and is placed around and maintained stationary relative to the shaft 161. However, it is optional that the first block 210 may be maintained stationary relative to the shaft 161 or rotate with the upper stool 160. The first block 210 includes convexes 212a and 212b, a groove 212c, a convex 215, an inner circumferential surface 216, and an outer circumferential surface 217.

The convexes 212a and 212b have the same height, but the outer convex 212b may be taller than the inner convex 212a viewed from the sun gear 156 in order to prevent a flow of fluid F onto the work W. The groove 212c has through-holes 213 at regular intervals. The through-holes 213 are used to supply (dispense or spray) the fluid F to the carrier 110. The convex 215 is placed near the teeth 156a. The inner circumferential surface 216 and the outer circumferential surface 217 are configured concentrically with respect to the shaft 141 when viewed from the top.

A wiper 220 is attached to the bottom of the outer circumferential surface 217 of the first block 210 between the teeth 156a of the sun gear 156 and the center 111a of the carrier 110, concentrically with the shaft 141, over a circumferential direction $M_1$. The wiper 220 is made of an elastic material, such as rubber, and contacts the top surface 112a of the carrier 110 at a contact location $112a_1$. The contact location $112a_1$ sits between the sun gear 156 (or teeth 118 of the carrier 110 which contact the sun gear 156) and the hole 113 in the carrier 110 when viewed from the top in the Z direction. The wiper 220 serves to prevent dust, which has been generated due to the engagements between the teeth 118 of the carrier 110 and the teeth 156a of the sun gear 156, from moving to the inside of the contact location $112a_1$ on the top surface 112a of the carrier 110.

The fluid supply nozzle 230 is a tube configured to supply the fluid F such as liquid (e.g., water) or gas (e.g., air) to the groove 212c in the first block 210. When the fluid F is a liquid, it drops on the top surface 112a of the carrier 110 via the through-holes 213 and flushes out the dusts. When the fluid F is a gas, it is blown on the top surface 112a of the carrier 110 via the through-holes 213 and blows out the dusts.

The fluid supply nozzle 230 is placed around and maintained stationary relative to the shaft 161 similarly to the first block 210. Since the fluid supply nozzle 230 does not rotate, one end of the fluid supply nozzle 230, for example, may be easily connected to a faucet of the waterworks.

A plurality of the fluid supply nozzles 230 may be placed concentrically around the shaft 161 as needed. The fluid supply nozzle 230 and the through-holes 213 constitute a first fluid supply part that supplies the fluid F to a space between the teeth 118 of the carrier 110 and the wiper 220.

The second dustproof mechanism 240 serves to prevent dusts, which have been generated by the engagements between the teeth 118 of the carrier 110 and the teeth 158a of the outer gear 158, from entering a space between the work W and the pad surface (polishing surface) 142a or 162a.

The second dustproof mechanism 240 has a second block 250, a wiper (second elastic member) 260, and a fluid supply nozzle 270.

The second block 250 has an annular shape, and is placed around and maintained stationary relative to the shaft 161. However, it is optional that the second block 250 may be maintained stationary relative to the shaft 161 or rotate with the upper stool 160. The second block 250 includes convexes 252a and 252b, a groove 252c, a convex 255, an inner circumferential surface 256, and an outer circumferential surface 257.

The convexes 252a and 252b have the same height, but the inner convex 252a may be taller than the outer convex 252a viewed from the sun gear 156 in order to prevent a flow of fluid F onto the work W.

The groove 252c has through-holes 253 at regular intervals. The through-holes 253 are used to supply (dispense or spray) the fluid F to the carrier 110. The convex 255 is placed near the teeth 158a. The inner circumferential surface 256 and the outer circumferential surface 257 are configured concentrically with respect to the shaft 141 when viewed from the top.

A wiper 260 is attached to the bottom of the outer circumferential surface 256 of the second block 250 between the teeth 156a of the outer gear 156 and the center 111a of the carrier 110, concentrically with the shaft 141, over a circumferential direction $M_2$. The wiper 260 is made of an elastic material, such as rubber, and contacts the top surface 112a of the carrier 110 at a contact location $112a_2$. The contact location $112a_2$ sits between the outer gear 158 (or teeth 118 of the carrier 110 which contact the outer gear 158) and the hole 113 of the carrier 110 when viewed from the top in the Z direction. The wiper 260 serves to prevent dust, which has been generated due to the engagements between the teeth 118 of the carrier 110 and the teeth 158a of the outer gear 158, from moving to the inside of the contact location $112a_2$ on the top surface 112a of the carrier 110.

The fluid supply nozzle 270 is a tube configured to supply the fluid F to the groove 252c on the second block 250. When the fluid F is a liquid, it drops on the top surface 112a of the carrier 110 via the through-holes 253 and flushes out the dusts. When the fluid F is a gas, it is blown on the top surface 112a of the carrier 110 via the through-holes 253 and blows out the dusts.

The fluid supply nozzle 270 is placed around and maintained stationary relative to the shaft 161, similarly to the second block 250. Since the fluid supply nozzle 270 does not rotate, one end of the fluid supply nozzle 270, for example, may be easily connected to the faucet of the waterworks.

A plurality of the fluid supply nozzles 270 may be placed concentrically around the shaft 161 as needed. The fluid supply nozzle 270 and the through-holes 253 constitute a second fluid supply part that supplies the fluid F to a space between the teeth 118 of the carrier 110 and the wiper 220.

Thus, the first and second dustproof mechanisms 200 and 240 protect the work W from the dusts generated from the planetary gear mechanism.

Turning now back to FIG. 1, the cylinder 170 is an air cylinder that applies a load or pressure to the work W between the lower and upper stools 140 and 160. The slurry supply 175 dispenses the slurry (or abrasive) on the top surface 160a of the upper stool 160. The upper stool 160 and the pad 162 have plural through-holes 163 that extend in the Z direction and penetrate the upper stool 160 and the pad 162. The slurry S is supplied on the polishing surface of the pad 162 via the through-holes 163. Then, the slurry S drops on the pad 142 of the lower stool 140, and is supplied to the polishing surface 142a. The slurry S of this embodiment is cerium oxide slurry. When the polishing apparatus 100 of this embodiment is a lapping apparatus, the slurry S includes abrasive particles dispersed in a solution.

The control unit 180 is connected to the motor 130, the gearbox 150, the tachogenerators 148 and 168, the cylinder 170, and the slurry supply 175. The control unit 180 controls a driving current applied to the motor 130, a gear ratio of the gearbox 150, a load applied by the cylinder 170, and a supply amount of the slurry supplied by the slurry supply 175 in accordance with the outputs of the tachogenerators 148 and 168.

The control unit 180 includes a CPU or MPU, a memory 182 that stores those data or programs necessary for the polishing method of this embodiment, and a timer 184 which measures time.

Figure 20:
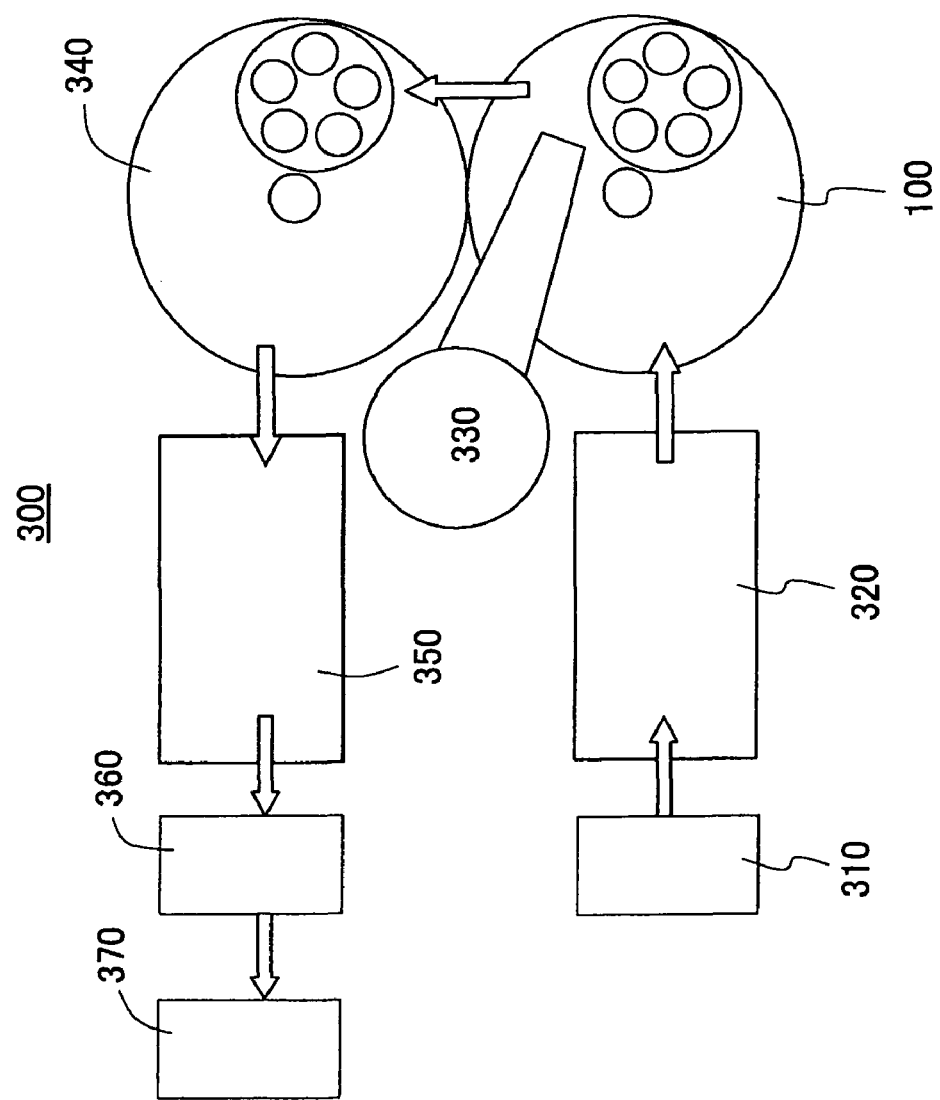
FIG. 20 is a schematic block diagram of a polishing system including the polishing apparatus shown in FIG. 1.

Referring now to FIGS. 20 to 24, a description will be given of an operation of a polishing system 300 including the polishing apparatus 100 and its operation. FIG. 20 is a schematic block diagram of the polishing system 300. The polishing system 300 includes an assembly unit 310, a loader 320, the polishing apparatus 100, a robot arm 330, an immediate cleaning apparatus 340, an unloader 350, a stocker 360, and a main cleaning apparatus 370.

The assembly 310 attaches the works W to the carrier 110, and fixes the works W in the holes 113 in the carrier 110 by using fixing members. The loader 320 attaches the carrier 110 that accommodates the works W to the polishing apparatus 100. The robot arm 330 detaches the carrier 110 from the polishing apparatus 100 after polishing, and attaches the carrier 110 to the immediate cleaning apparatus 340. The immediate cleaning apparatus 340 roughly cleanses the carrier 110 just after polishing. The unloader 350 delivers the carrier 110 from the immediate cleaning apparatus 340 to the main cleaning apparatus 370 after immediate cleaning (or tentative cleaning).

The stocker 360 stores the carrier 110 in pure water or a solution so as to prevent drying of the works W before the main cleaning. The main cleaning apparatus 370 thoroughly cleans the carrier 110 which has been roughly cleaned by the immediate cleaning apparatus 340. The main cleaning apparatus 370 cleans the carrier 110 with hydrofluoric acid, super critical fluid, or ultrasonic cleanser.

Figure 21:
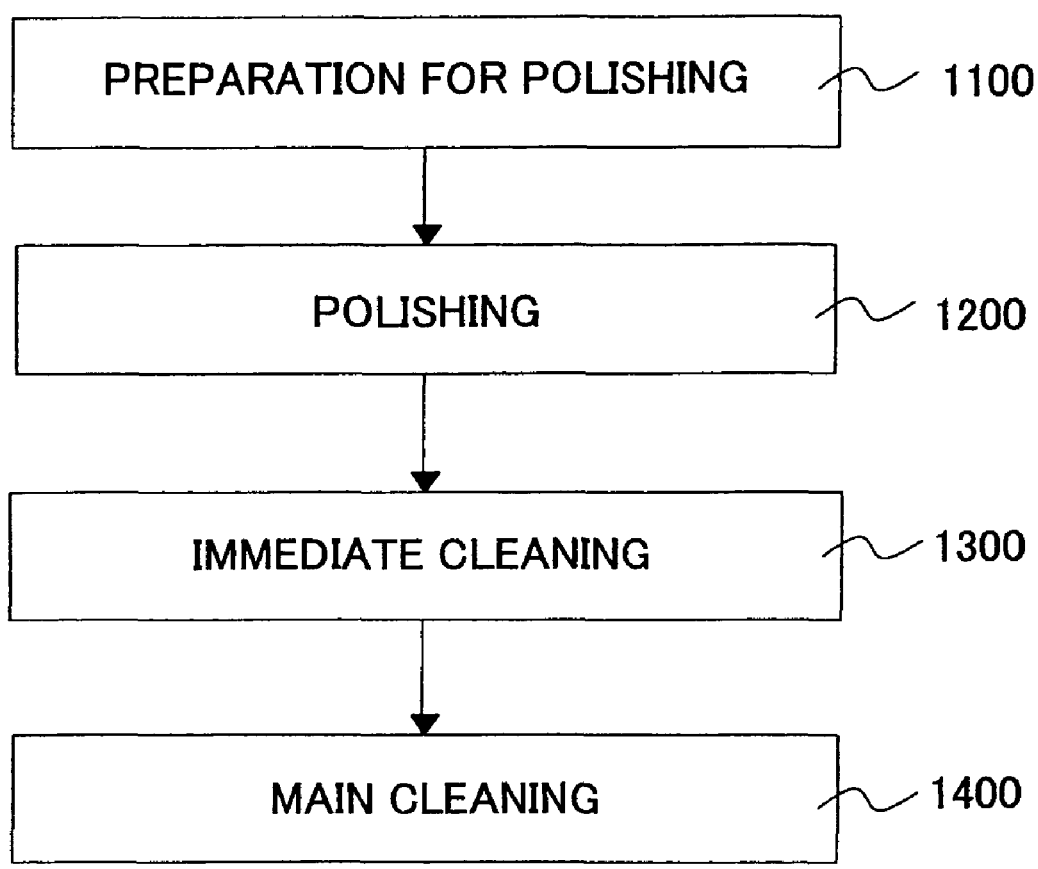
FIG. 21 is a flowchart that describes how the polishing system shown in FIG. 20 operates.

Referring now to FIG. 21, a description will be given of a polishing method performed by the polishing system 300. FIG. 21 is a flowchart for explaining an operation of the polishing System 300.

Figure 22:
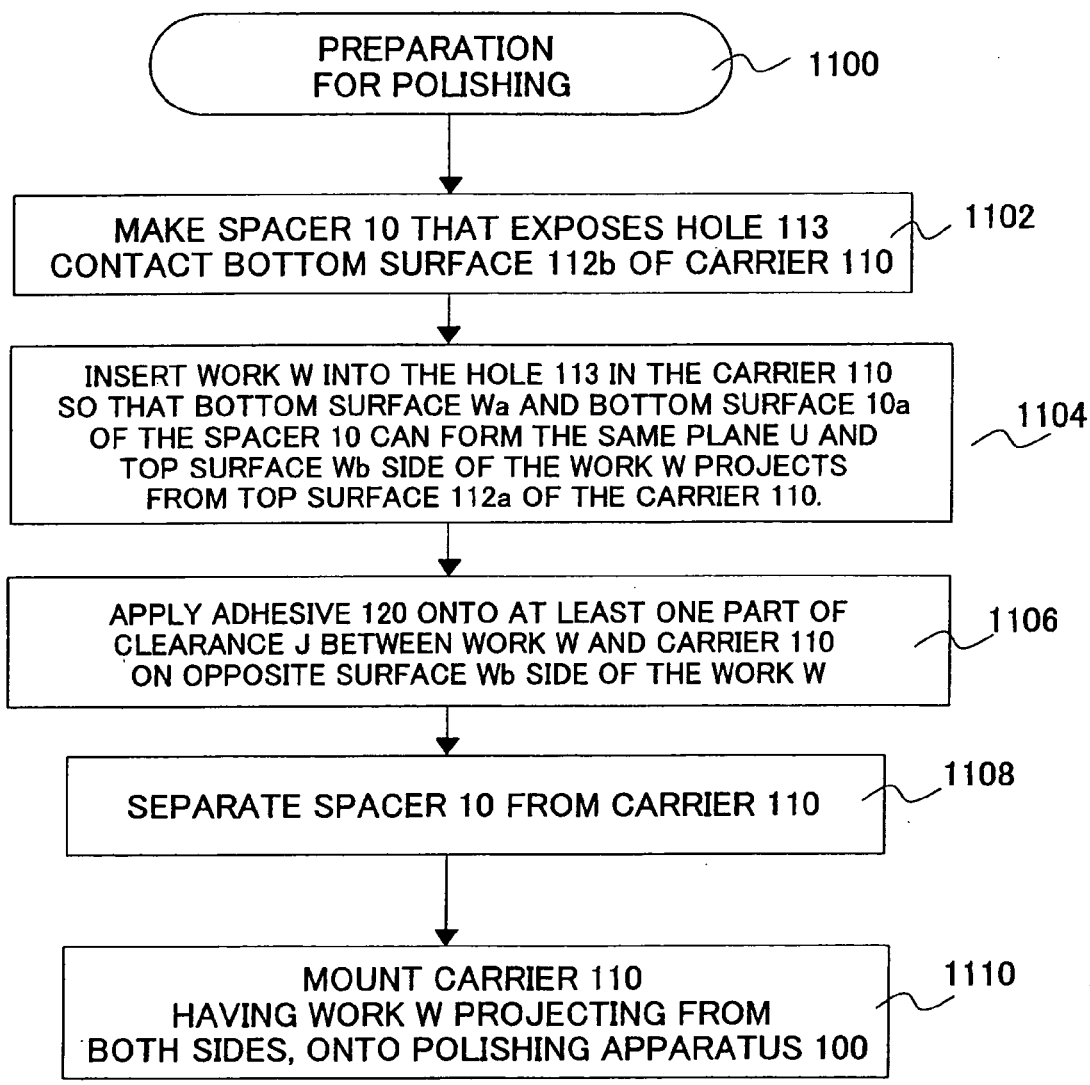
FIG. 22 is a flowchart that describes the details of the step 1100 shown in FIG. 21.

Initially, a polishing preparation is performed (step 1100). For the polishing preparation in step 1100, a description will be given of use of the adhesive 120 shown in FIG. 3 as the fixing member. FIG. 22 is a flowchart for explaining the details of the step 1100 shown in FIG. 21. FIGS. 23A to 23D are schematic sectional views that illustrate each step in FIG. 22.

As shown in FIG. 23A, a spacer 10 that exposes the holes 113 contacts the bottom surface 112b of the carrier 110 (step 1102). The spacer 10 contacts the carrier 110 after they are aligned with each other (for example, after their ends are aligned with each other). They may be tacked as necessary. A ring member 18 can be used to place the spacer 10 and the carrier 110 in the ring member 18 so as to position them in a direction perpendicular to the Z direction. Instead of the spacer 10, a container shown in FIG. 24 having steps similar to the spacer 10 may be used. This embodiment refers to those members that include the above container as a "spacer."

The spacer 10 has the same size such as a diameter N as the carrier 110, and has a base 11 and a through-hole 13, like the carrier 110. The through-hole 13 has a shape substantially equal to that of the hole 113, but is slightly larger than the hole 113. The spacer 10 has a thickness $h_1$, and differs from the carrier 110 that has a different thickness $h_2$. In general, $h_1 < h_2$ is met. As described later, the thickness $h_1$ has a length by which the work W projects from the bottom surface 112b of the carrier 110.

The spacer 10A has a base 11A including a step 11A$_1$ corresponding to the base 11 of the space 10. The spacer 10A has a diameter N substantially equal to the outer diameter of the carrier 110, an accommodation part 15 with a thickness h$_2$, and a concave 13A with the same size as the through-hole 13. The spacer 10A also has a wall 11A$_2$ with a dimension of V$_1$×V$_2$, corresponding to the ring member 18. This structure facilitates positioning of the carrier 110 relative to the spacer 10A.

In the arrangement of the step 1102, the hole 113 on the carrier 110 can be fully observed through the through-hole 13 in the spacer 10 when the through-hole 13 of the spacer 10 is viewed from the bottom in the V direction, or in other words the hole 113 is not shielded by the base 11 of the spacer 10. Even in the arrangement using the spacer 10A, the hole 113 is not shielded by the step 11A$_1$ of the spacer 10A.

A shape of the spacer 10 is not limited, and its shape does not have to be the same as the carrier 110 as long as the spacer 10 has the thickness of h$_1$ and there is a through-hole that exposes all the holes 113.

Next, as shown in FIG. 23B, the work W is inserted into the hole 113 in the carrier 110 so that a bottom Wa of the work W and a bottom 10a of the spacer 10 form the same plane U and a top surface Wb of the work W can project from the carrier 110 (Step 1104). In case of the spacer 10A, the above condition is satisfied by partially inserting the work W into the concave 13A since the bottom surface of the concave 13A and the dot lined bottom surface of the step 11A$_1$ form the same plane.

A length that the work W projects from the top surface 112a of the carrier 110 is h$_1$ and is equal to a length by which the work W projects from the bottom surface 112b. This is because this embodiment expects the same polished amount for both surfaces Wa and Wb of the work W in the Z direction.

The step 1104 may be implemented, for example, by placing a structure shown in FIG. 23A on a horizontal table, and by inserting the work W into the hole 113 in the carrier 110 from the top. The horizontal table of this embodiment is a hotplate, but the spacer 10A may be heated. FIG. 23B shows only one work W for convenience. The condition shown in FIG. 23B may be formed by making the spacer 10 contact one surface of the carrier 110 after the work W is inserted into the hole 113 in the carrier 110. Alternatively, the condition may be formed by inserting the carrier 110 into the spacer 10A after the work W is inserted into the hole 113 in the carrier 110.

Next, the adhesive 120 is applied to at least part of the clearance J between the work W and the carrier 110 on the opposite surface of the work W (or the top surface Wb) (step 1106). Here, "at least part of the clearance J" intends to allow the adhesive 120 not be completely filled in the clearance J over the whole circumference.

In applying the adhesive 120 using a dispenser 20, the adhesive 120 does not have to be precisely put in the clearance J as shown in FIG. 23C, and part of the adhesive 120 may be put on the top surface Wb of the work W because the adhesive 120 is soft and removable by polishing. The amount or position of the adhesive 120 shown in FIG. 23C are illustrative.

As described above, the adhesive 120 of this embodiment is alcowax®. When the adhesive 120 is dropped after the structure shown in FIG. 23B is arranged so that the plane U can become a top surface of a hotplate (not shown), the adhesive 120 is heated by the hotplate and permeates the clearance J by a capillary action. Then, the adhesive 120 becomes solidified when the temperature returns to the room temperature. In this embodiment, the liquefying adhesive 120 is less likely to create a projection shown in FIG. 23C on the top surface Wb of the work W. Spacing between the base 11 of the spacer 10 and the work W in the through-hole 13 or spacing between the work W and the step 11A$_1$ of the space 10A in the concave 13A is wider than the clearance J, and the adhesive 120 does not fill this spacing.

Next, the spacer 10 is separated from the carrier 110 in the structure shown in FIG. 23C (step 1108). FIG. 23D shows this state.

The steps 1102 to 1108 are performed in the assembly unit 310.

Next, the loader 320 attaches to the polishing apparatus 100 the carrier in which the works W project from the top surface 112a and the bottom surface 112b (step 1110).

A fixation of the work W into the carrier 110 as in this embodiment is a characteristic that is not provided to any conventional double-sided lapping apparatuses. In general, the conventional double-sided lapping apparatus does not use the spacer 10 shown in FIG. 23B or bond the clearance J between the work W and the carrier 110. Therefore, when the carrier 110 that is mounted with the works W is installed in the lapping apparatus, each work W projects from only one side of the carrier 110 (e.g., from the top surface 112a side), causing the bottom surface Wa of the works W and the bottom surface 112b of the carrier 110 to form the same plane.

In a double-sided lapping apparatus, pads having the top and bottom polishing surfaces are made of metal or ceramic. Therefore, a stool in the lapping apparatus may be called a hard stool. Suppose that the work W and the carrier 110 are not fixed and the carrier 110 is movable when the upper and lower hard stools compress the work W. Then, only the work W can be polished. Therefore, the structure shown in FIG. 23D does not need to be formed.

On the other hand, in a CMP apparatus, pads having the top and bottom polishing surfaces are made of a soft material, such as urethane. Therefore, a stool in the lapping apparatus may be called a soft stool. If the bottom surface Wa of the work W and the bottom surface 112b of the carrier 110 form the same plane when the upper and lower soft stools compress the work W, the CMP apparatus would polish the carrier 110 in addition to the work W and absorb the carrier 110. Therefore, the structure shown in FIG. 23D is effective to avoid such cases. The structure shown in FIG. 23D is also applicable to both the double-sided CMP apparatus and the double-sided lapping apparatus.

Figure 25:
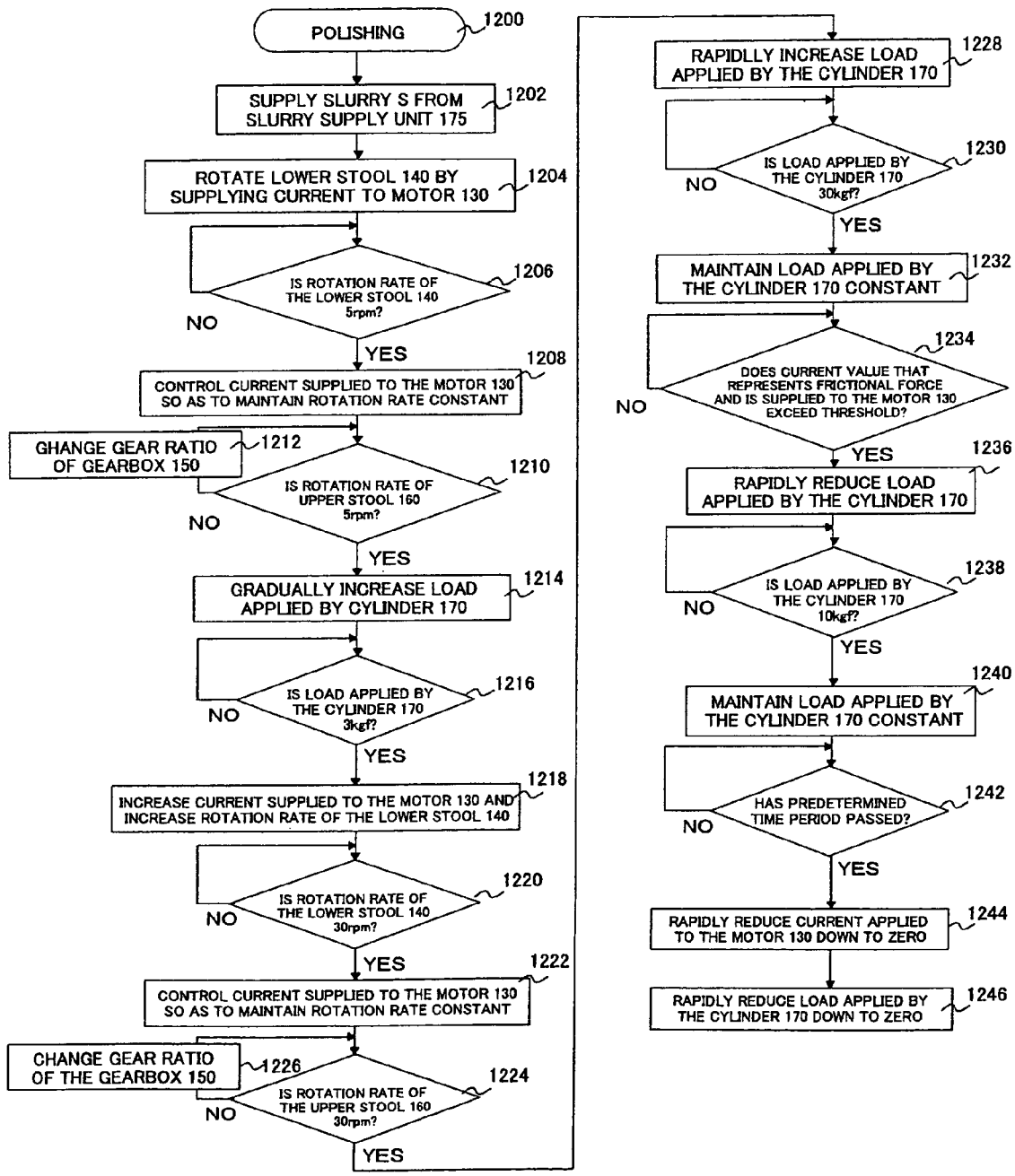
FIG. 25 is a flowchart that describes the details of the step 1200 shown in FIG. 21.
Figure 26:
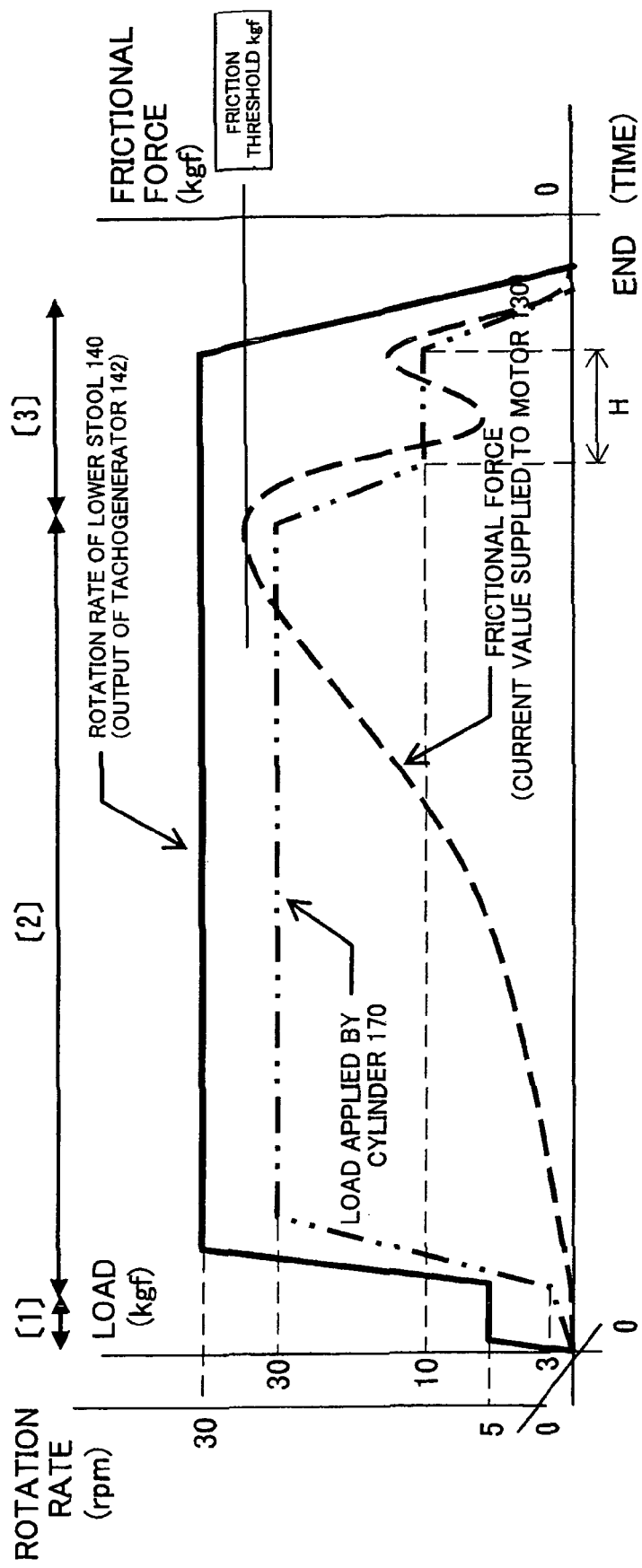
FIG. 26 is a timing chart that describes a state of each step shown in FIG. 25.

Next, polishing is provided with the polishing apparatus 100 (step 1200). FIG. 25 is a flowchart for explaining the details of step 1200 shown in FIG. 21. FIG. 26 is its timing chart, where ordinate axes denote a rotation rate (rpm) of the lower stool 140, a load (kgf) applied by the cylinder 170, and a frictional force (kgf), and an abscissa axis denotes time. However, this embodiment replaces the frictional force (kgf) in the ordinate axis with a current value (A) which represents a frictional force.

Initially, the control unit 180 starts supplying the slurry S from the slurry supply unit 175 to the top surface of the upper stool 160 (Step 1202). A proper supply amount of the slurry S has previously been obtained by a simulation or an experiment, and stored in a memory 182. The control unit 180 controls the slurry supply unit 175 so as to dispense the slurry S by the stored supply amount.

As the supply amount of the slurry S by the slurry supply unit 175 increases, the lower and upper stools 140 and 160 increase polishing amounts at an equal rate. Therefore, the control unit 180 increases the supply amount of the slurry S in increasing the polishing amount as a whole. The control unit 180 reduces the supply amount of the slurry S in reducing the polishing amount as a whole. In other words, according to this embodiment, when the polishing amounts of the lower and upper stools 140 and 160 are different, the supply amount control over the slurry supply unit 175 cannot cancel this difference.

The control unit 180 supplies the current to the motor 130, and rotates the lower stool 140 (step 1204) as well as in the step 1202.

Next, the control unit 180 determines whether the rotation rate (the number of revolutions) of the lower stool 140 is 5 rpm (step 1206). The control unit 180 makes this determination in the step 1206 by comparing an output of the tachogenerator 148 indicating a rotation rate of the lower stool 140 with a value of 5 rpm stored in the memory 182. 5 rpm is a mere illustration of a slow rotation, and the present invention is not limited to this rotation rate.

When determining that the rotation rate of the lower stool 140 is 5 rpm (step 1206), the control unit 180 controls the current supplied to the motor 130 so as to make the rotation rate of the lower stool 140 constant (step 1208).

As polishing to the work W proceeds, the polished surfaces (or the bottom surface Wa and the top surface Wb) become more planer, and an adhesion to the polishing surface (pad surface) and a frictional force increase. Thus, when a current value supplied to the motor 130 is constant, the rotation rate gradually decreases. Therefore, in the step 1208, the control unit 180 gradually increases the current value supplied to the motor 130 so as to make the output of the tachogenerator 148 constant. The control unit 180 continues this control until the rotation rate of the lower stool 140 becomes 5 rpm.

Next, the control unit 180 determines whether the rotation rate of the upper stool 160 is 5 rpm (step 1210). The control unit 180 makes this determination in the step 1210 by comparing an output of the tachogenerator 168 indicating a rotation rate of the upper stool 160 with a value of 5 rpm stored in the memory 182.

In this embodiment, both the top and bottom polishing surfaces have the same polishing ability, and if their rotation rates are not made equal, a polishing amount difference occurs between the top and bottom polishing surfaces. When determining that the rotation rate of the upper stool 160 is not 5 rpm (step 1210), the control unit 180 controls the gearbox 150 and changes a gear ratio (transmission ratio) (step 1212). Then, the procedure returns to between the step 1208 and the step 1210.

On the other hand, when determining that the rotation rate of the upper stool 160 is 5 rpm (step 1210), the control unit 180 gradually increases the load applied by the cylinder 170 (step 1214).

Next, the control unit 180 determines whether the load applied by the cylinder 170 is 3 kgf (step 1216). When determining that the load applied by the cylinder 170 is 3 kgf (step 1216), the control unit 180 increases the current applied to the motor 130 and the rotation rate of the lower stool 140 (step 1218). The control unit 180 continues this control until it determines that the load applied by the cylinder 170 is 3 kgf.

Next, the control unit 180 determines whether the rotation rate of the lower stool 140 is 30 rpm (step 1220). The control unit 180 makes this determination in the step 1220 by comparing the output of the tachogenerator 148 indicating the rotation rate of the lower stool 140 with a value of 30 rpm stored in the memory 182. 30 rpm is a mere illustration of a normal polishing rate. The present invention is not limited to this rotation rate.

When determining that the rotation rate of the lower stool 140 is 30 rpm (step 1220), the control unit 180 controls the current supplied to the motor 130 so as to make the rotation rate of the lower stool 140 constant (step 1222).

As polishing of the work W proceeds, the polished surfaces (or the bottom surfaces Wa and the top surfaces Wb) become more planer, and an adhesion to the polishing surface (pad surface) and a frictional force increase. Thus, when a current value supplied to the motor 130 is constant, the rotation rate gradually decreases. Therefore, in the step 1222, the control unit 180 gradually increases the current value supplied to the motor 130 so as to make the output of the tachogenerator 148 constant. When determining that the rotation rate of the lower stool 140 is not 30 rpm, the control unit 180 returns the procedure to the step 1220.

Next, the control unit 180 determines whether the rotation rate of the upper stool 160 is 30 rpm (step 1224). The control unit 180 makes this determination in the step 1224 by comparing the output of the tachogenerator 168 indicating the rotation rate of the upper stool 160 with the value of 30 rpm stored in the memory 182.

In this embodiment, both the top and bottom polishing surfaces 142*a* and 162*a* have the same polishing ability, and if their rotation rates are not equal, a polishing amount difference occurs between the top and bottom polishing surfaces. When determining that the rotation rate of the upper stool 160 is not 30 rpm (step 1224), the control unit 180 controls the gearbox 150 and changes a gear ratio (step 1226). Then, the procedure returns to the step 1224.

On the other hand, when determining that the rotation rate of the upper stool 160 is equal to 30 rpm (step 1224), the control unit 180 rapidly increases the load applied by the cylinder 170 (step 1228).

Next, the control unit 180 determines whether the load applied by the cylinder 170 is 30 kgf (Step 1230). When determining that the load applied by the cylinder 170 is 30 kgf (Step 1230), the control unit 180 maintains the load applied by the cylinder 170 (step 1232). The control unit 180 continues this control as long as it determines the load applied by the cylinder 170 is 30 kgf, thereby providing thorough simultaneous polishing of both surfaces Wa and Wb of the work W.

Next, the control unit 180 determines whether the current value supplied to the motor 130 exceeds a threshold (step 1234). As described above, as polishing of the works W proceeds, both the frictional forces between the work W and the polishing surfaces increase, and the current value applied to the motor 130 increases. Therefore, the current value supplied the motor 130 represents a frictional force. The threshold is stored in the memory 182 in advance. The work W oscillates in the hole 113 as the frictional force increases, and the threshold is set lower than a non-negligible critical point. The control unit 180 monitors the current value supplied to the motor 130, and prevents dusts generations due to collisions between the work W and the carrier 110.

The control unit 180 may use torque sensors 190*a* and 190*b* instead of the current value. The torque sensor 190*a* is adhered, for example, to an appropriate spot on the pad 142, and directly detects a frictional force between the pad 142 and the bottom surface Wa of the work W. The torque sensor 190*b* is adhered, for example, to an appropriate spot on the pad 162, and directly detects a frictional force between the pad 162 and the top surface Wb of the work W. However, this embodiment monitors the current value, and thus does not need the torque sensors 190*a* and 190*b*.

When determining that the frictional force (or output value of the torque sensor or current value supplied to the motor 130) exceeds a threshold (step 1234), the control unit 180 rapidly reduces the load applied by the cylinder 170 (step 1236). However, it does not reduce the load down to zero. The control unit 180 continues this control until the frictional force exceeds the threshold.

That the frictional force between the pad surface 142a of the pad 142 on the lower stool 140 and the bottom surface Wa of the work W exceeds the threshold in the step 1234 means that the surface roughness on the bottom surface Wa of the works W falls within a targeted range. However, there may be a difference in polishing amount between the stools 140 and 160. In this case, the surface roughness of the top surface Wb of the work W may not fall within the targeted range even when the surface roughness of the bottom surface Wa of the work W falls within the targeted value.

Accordingly, the control unit 180 determines whether the load applied by the cylinder 170 is 10 kgf (step 1238). "10 kgf" is selected from a load range that can be used for polishing without vibrating and damaging the work W. This load range can be obtained through an experiment or simulation. In this embodiment, the load range is approximately 10 kgf to 15 kgf.

When determining that the load applied by the cylinder 170 is 10 kgf (step 1238), the control unit 180 maintains this condition without changing the rotation rates of the lower and upper stools 140 and 160 until a predetermined time period H elapses (steps 1240 and 1242). The predetermined time period H can be obtained through an experiment or simulation and stored in the memory 182. The predetermined time period is measured by the timer 184. As a result, a polishing amount difference between the lower and upper stools 140 and 160 of the works W can be cancelled. Since the bottom surface Wa of the works W has already fallen within the targeted range, the surface roughness on the top surface Wb of the works W can fall within the targeted range in the predetermined time period H. The control unit 180 continues this process as long as it determines that the load applied by the cylinder 170 is 10 kgf.

This embodiment changes the load but may also change the gear ratio and the rotation rates of the lower and upper stools 140 and 160. Alternatively, as described later, when the motor is attached to the upper stool 160, the current supplied to the motor may be controlled so as to change the rotation rate.

When determining that the predetermined time period H elapses (step 1242), the control unit 180 rapidly reduces the current applied to the motor 130 down to zero (step 1244), and rapidly reduces the load applied by the cylinder 170 down to zero (step 1246). According to this embodiment, both surfaces Wa and Wb of the work W can be polished with the surface roughness RA of 5 nm or smaller and without generating dusts.

In FIG. 26, [1], [2], and [3] represent one minute, two minutes, and three minutes respectively for illustrative purposes. Referencing the timer 184, the control unit 180 may indicate an error message on a display (not shown) when the steps up to 1216 are not completed in a minute. Similarly, referencing the timer 184, the control unit 180 may indicate an error message on a display (not shown) when the steps up to 1234 are not completed in the following two minutes. In addition, referencing the timer 184, the control unit 180 may indicate an error message on a display (not shown) when the steps up to 1246 are not completed in the following three minutes. In this case, the control unit 180 responds by adjusting the subsequent supply amount of the slurry S.

The steps 1210, 1212, 1224, and 1226 control a gear ratio of the gearbox 150 so as to make the rotation rates of the lower and upper stools 140 and 160 equal to each other. In the double-sided polishing, even when the rotation speeds of the lower and upper stools 140 and 160 or the structures of the pads 142 and 162 are made equal to each other, a difference in polishing amount constantly occurs with similar tendencies due to the environmental factors such as the gravity force. For example, due to the gravity, the load and the slurry amount differently affect polishing by the lower stool 140 and polishing by the upper stool 160.

When a difference in polishing amount is previously known by a simulation and experiment, a difference in rotation rate corresponding to the difference in polishing amount may be set in the lower and upper stools 140 and 160. For example, when the polishing amount by the pad 142 of the lower stool 140 is greater than that by the pad 162 of the upper stool 160, the rotation speed $R_1$ of the lower stool 140 is made smaller than the rotation speed $R_2$ of the upper stool 160 ($R_1 < R_2$). Since it is impossible for double-sided polishing to polish one polishing surface without polishing the other polishing surface, it is necessary to make the polishing amounts for both surfaces equal to each other when polishing of both surfaces simultaneously ends at a certain time. It is therefore preferable to set $R_1$ and $R_2$ so that the polishing amounts per unit time are equal between the lower and upper stools 140 and 160.

In FIG. 26, when the frictional force exceeds a threshold, the control unit 180 reduces the load applied by the cylinder 170 while maintaining the rotation rates of both stools. However, in another embodiment, the control unit 180 may maintain the load constant, and may change the rotation rate of the stool and/or a gear ratio of the gearbox 150 and/or the supply amount of the slurry S by the slurry supply unit 175. Moreover, the predetermined time period H is not necessarily provided, and may not be provided when the difference in polishing amount between the stools 140 and 160 is negligible. Alternatively, even when the polishing amount difference between the stools 140 and 160 is significant, the polishing amount difference may be previously cancelled by adjusting each component. For example, when the polishing amount difference is double, the gear ratio may be set to one to two, or a temperature of the polishing surface on one side may be made different from that on the other side, so as to cancel the polishing amount difference in advance.

Figure 27:
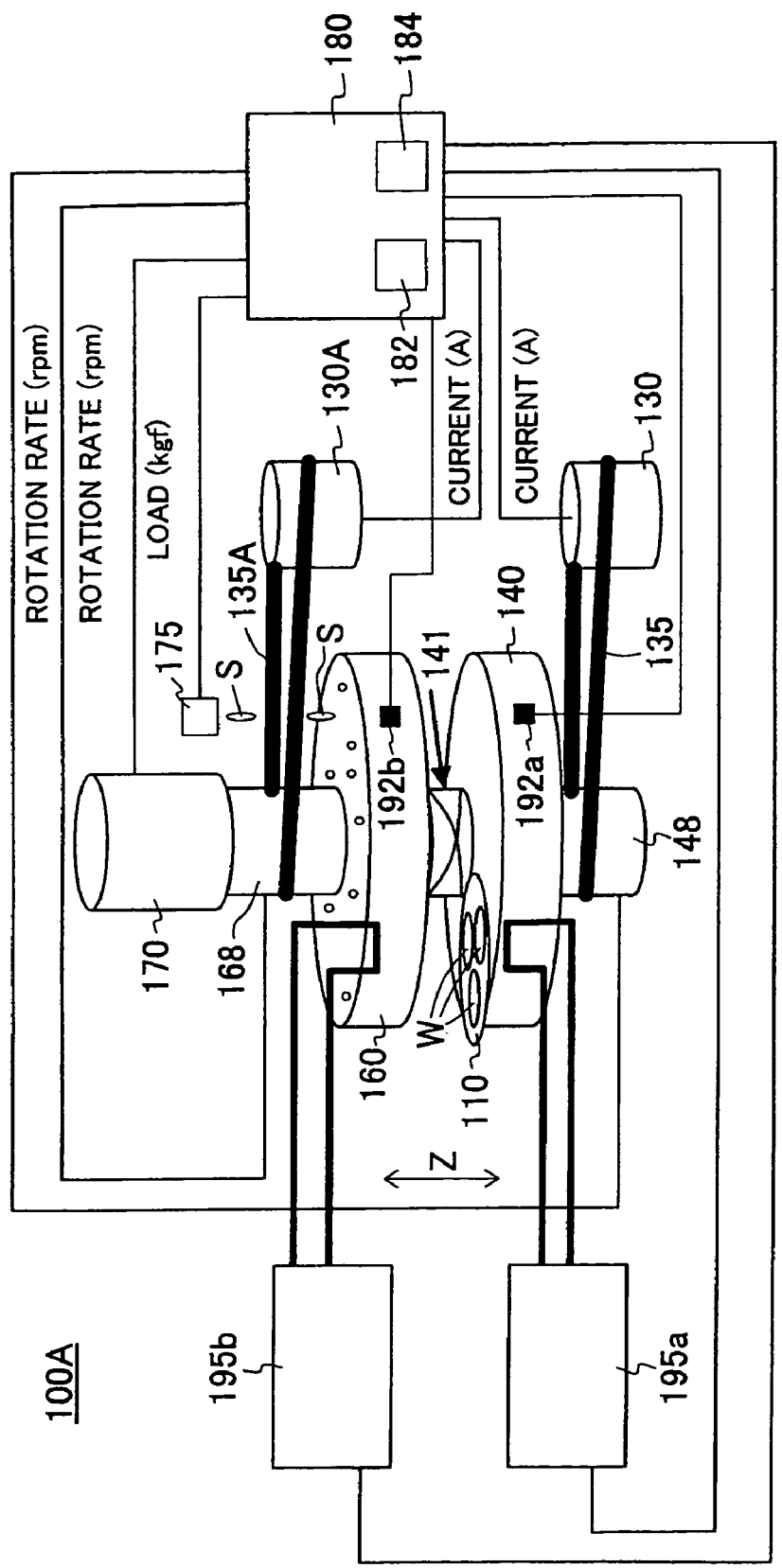
FIG. 27 is a schematic block diagram that shows a variation of the polishing apparatus shown in FIG. 1.

The polishing apparatus 100 shown in FIG. 1 commonly uses the motor 130 for driving the lower and upper stools 140 and 160, but may use two separate motors for both stools. FIG. 27 is a block diagram of a polishing apparatus 10A. Those elements in FIG. 27, which are the corresponding elements in FIG. 1, will be designated by the same reference numerals and a description thereof will be omitted.

The polishing apparatus 100A connects a motor 130A to the tachogenerator 168 via a transfer mechanism 135A. The motor 130A has the same structure as that of the motor 130, and the transfer mechanism 135A has the same structure as that of the transfer mechanism 135. Since the shaft 141 has no gearbox 150 and does not transfer to the shaft 161 the driving force applied to the shaft 141, the control unit 180 does not control the gear ratio. However, the sun gear 156 is provided at the outer circumference of the shaft 141. The upper stool 160 receives the driving force only from the motor 130A.

The polishing apparatus 101A includes a pair of temperature measurement units 192a and 192b connected to the control unit 180, and a pair of cooling units 195a and 195b connected to the control unit 180.

The temperature measurement unit 192a measures the temperature of the polishing surface 142a. The temperature measurement unit 192a may measure the temperature of the lower stool 140 or pad 142 with or without a necessary operation to the measurement result to obtain the temperature on the surface 142a. The temperature measurement unit 192b measures the temperature of the polishing surface 142a. The temperature measurement unit 192b may measure the temperature of the upper stool 160 or the pad 162 with or without a necessary operation to the measurement result to obtain the temperature on the surface 162a. The cooing unit 195a cools the polishing surface 142a, and the cooling unit 195b cools the polishing surface 162a.

The control unit 180 controls cooling of each of a pair of the cooling units 195a and 195b based on the measurements results of a pair of the temperature measurement units 192a and 192b. The polishing amount depends on the temperature of the polishing surface. For example, the polishing amount of the polishing surface controlled to be 27° C. is larger than that of the polishing surface controlled to be 25° C. Thus, the control is made so as to prevent a temperature change of the polishing surface during polishing.

As in the flowchart shown in FIG. 25, when a polishing state can be considered to be equal between the top and bottom polishing surfaces, the control unit 180 controls cooling of each of a pair of the cooling units 195a and 195b so that temperatures measured by a pair of the temperature measurement units 192a and 192b can be equal.

On the other hand, when the polishing amount difference is previously known by a simulation or experiment, a temperature difference corresponding to the polishing amount difference may be set in the lower and upper stools 140 and 160. For example, when the polishing amount by the pad 142 of the lower stool 140 is greater than that by the pad 162 of the upper stool 160, the temperature $T_1$ of the polishing surface 142a of the lower stool 140 is made lower than the temperature $T_2$ of the polishing surface 162 of the upper stool 160 ($T_1 < T_2$). Since it is impossible for double-sided polishing to polish one polishing surface without polishing the other polishing surface, it is necessary to make the polishing amounts for both surfaces equal to each other when polishing of both surfaces simultaneously ends at a certain time. It is therefore preferable to set $T_1$ and $T_2$ so that the polishing amounts per unit time are equal between the lower and upper stools 140 and 160.

In the polishing apparatus 100A, a graph shown in FIG. 26 has the frictional force and the rotation rate of the upper stool 160. Since the current values applied to the motors 130 and 130A represent the frictional forces, the control unit 180 determines whether each frictional force exceeds a threshold. When determining that the frictional force exceeds the threshold, the control unit 180 makes zero the rotation rate of the stool that exceeds the threshold. Of course, as described above, the control unit 180 may control the temperature or load.

After polishing, the robot arm 330 delivers the carrier 110 from the polishing apparatus 100 to the immediate cleaning apparatus 340, and attaches the carrier 110 to the immediate cleaning apparatus 340 (step 1300). The immediate cleaning apparatus 340 has a structure similar to the polishing apparatus 100 other than using pure water in place of the slurry S. Therefore, the work W can be immediately cleaned only by detaching the carrier 110 from the polishing apparatus 100 and attaching it to the immediate cleaning apparatus 340.

After the immediate cleaning ends, the unloader 350 delivers the carrier 110 from the immediate cleaning apparatus 340 to the stocker 360, and then the main cleaning apparatus 370 cleans the carrier 110 by using the stocker 360 as it is or by transferring the carrier from the stocker 360 to another container (step 1400). The main cleaning apparatus 370 provides main cleaning of the work W only by attaching the carrier 110 to a tank that stores hydrofluoric acid. Instead of hydrofluoric acid, super critical fluid or ultrasonic cleanser may be used. Only a transportation of the carrier 110 is needed and the operability improves because it is unnecessary to detach the work W from the carrier 110.

Figure 28:
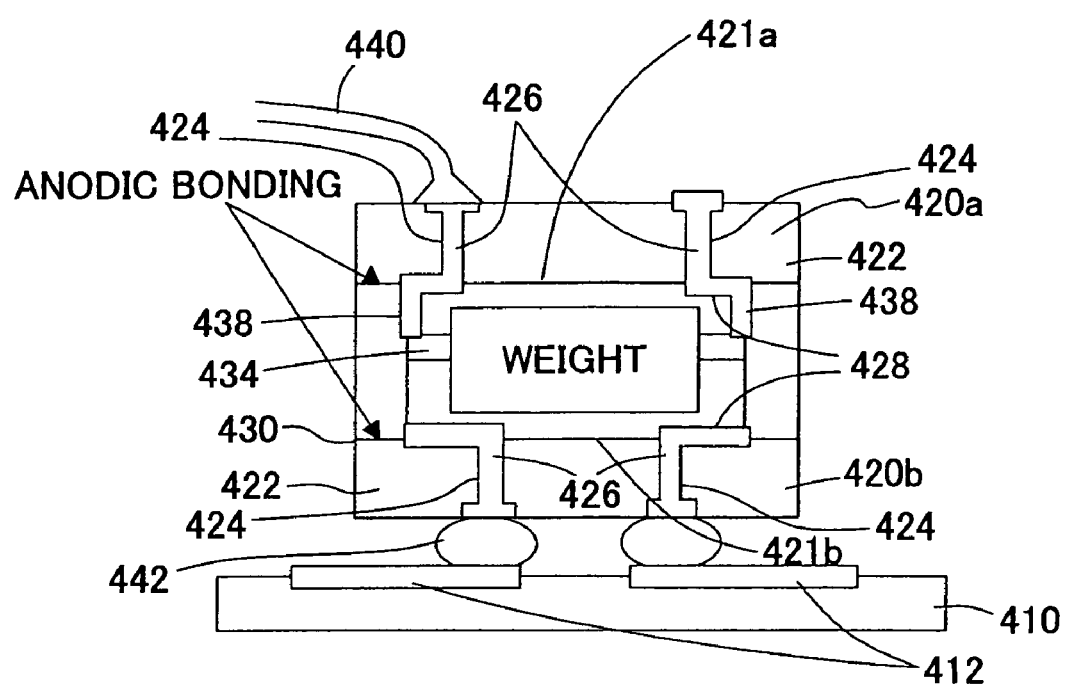
FIG. 28 is a schematic sectional diagram of a MEMS sensor.

Referring now to FIGS. 28 to 31, a description will be given of a manufacturing method of an electrical apparatus. Here, the manufacturing method of a MEMS sensor (electrical apparatus) will be described. FIG. 28 is a schematic sectional view of a MEMS sensor 400. The MEMS sensor 400 includes a circuit substrate 410, a pair of glass substrates 420a and 420b, a MEMS chip (electrical component) 430, and wiring parts 440 and 442.

The MEMS sensor 400 joins a pair of the glass substrates 420a and 420b to both sides of the MEMS chip 430, and need the degree of flatness Ra of about 5 nm on surfaces 421a and 421b of the glass substrates 420a and 420b opposite to the MEMS chip 430. It is conceivable to planarize only surfaces 421a and 421b of the glass substrates 420a and 420b opposite to the MEMS chip 430, but the manufacture becomes easier when the front and back surfaces of the glass substrates 420a and 420b are not distinguished. In planarizing both surfaces of the glass substrates 420a and 420b, it is preferable for the improvement of the throughput to simultaneously planarize both surfaces. In this embodiment, the above work W corresponds to the glass substrates 420a and 420b. The glass substrates may be identical or different.

Figure 29:
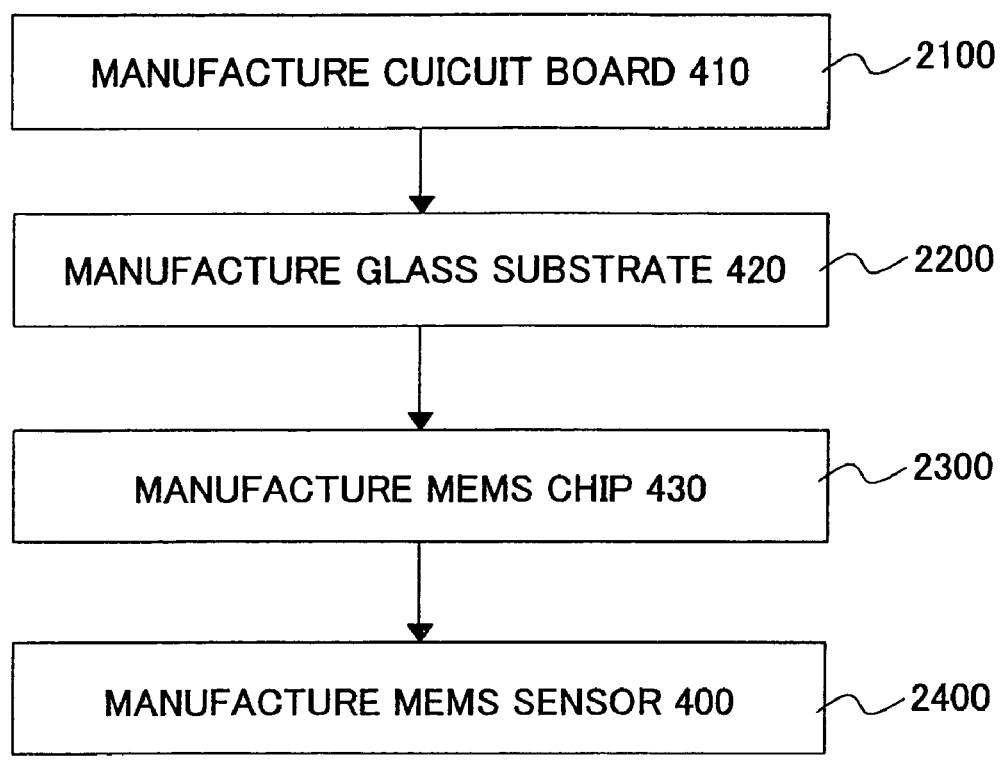
FIG. 29 is a flowchart that describes a manufacturing method of the MEMS sensor shown in FIG. 28.

FIG. 29 is a flowchart for explaining a manufacturing method of the MEMS sensor 400. The chronological order of the steps 2100 to 2300 is not restricted.

Initially, a circuit board 410 is manufactured by using the known technology (step 2100). The circuit board 410 has the wiring pattern 412 on its front surface.

Figure 30:
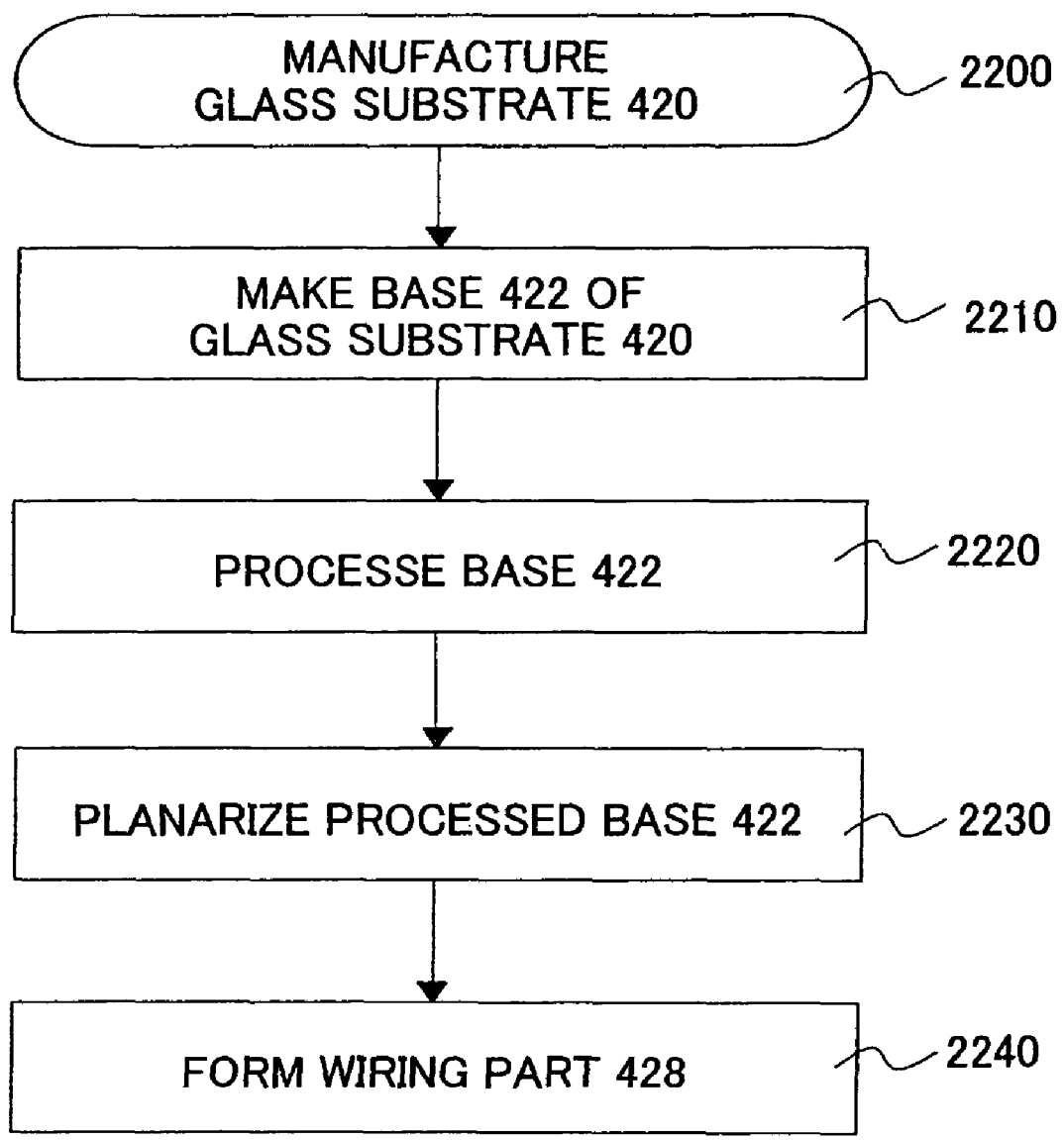
FIG. 30 is a flowchart which describes the details of the step 2200 shown in FIG. 29.
Figure 31:
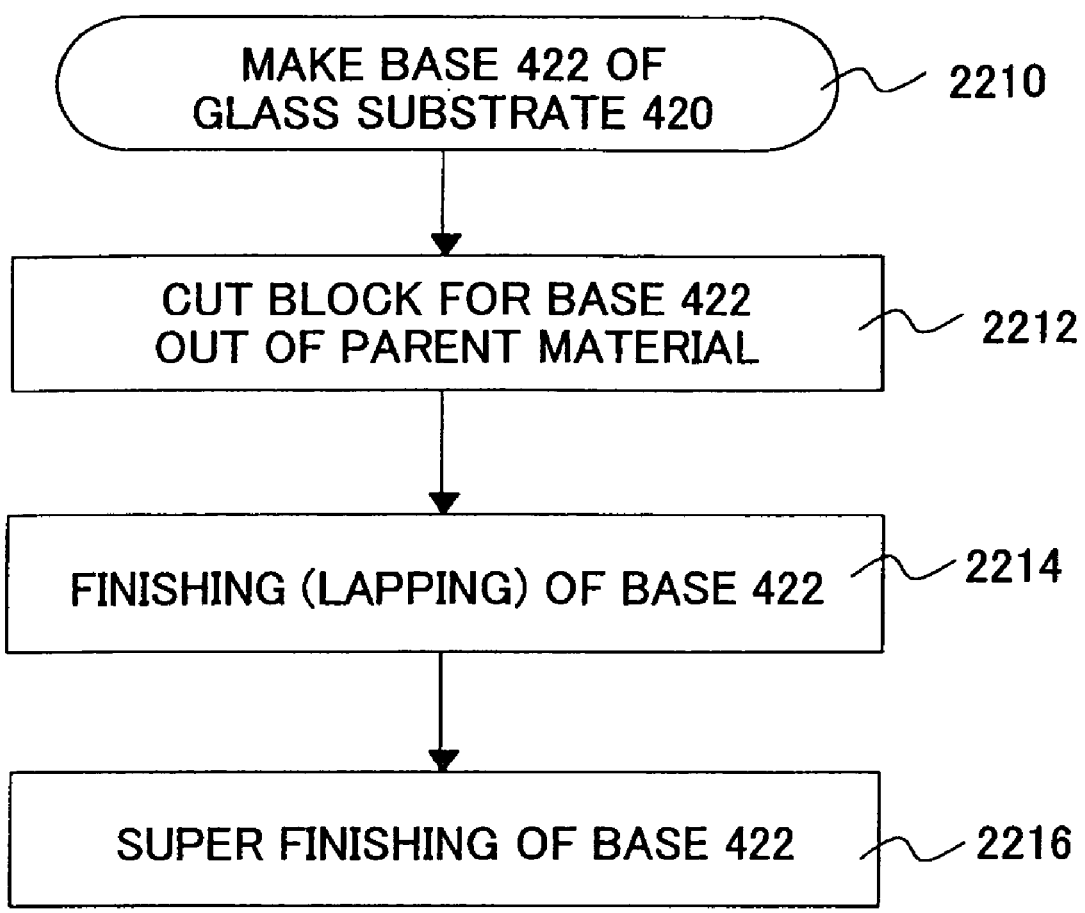
FIG. 31 is a flowchart which describes the details of the step 2210 shown in FIG. 30.
Figure 32:
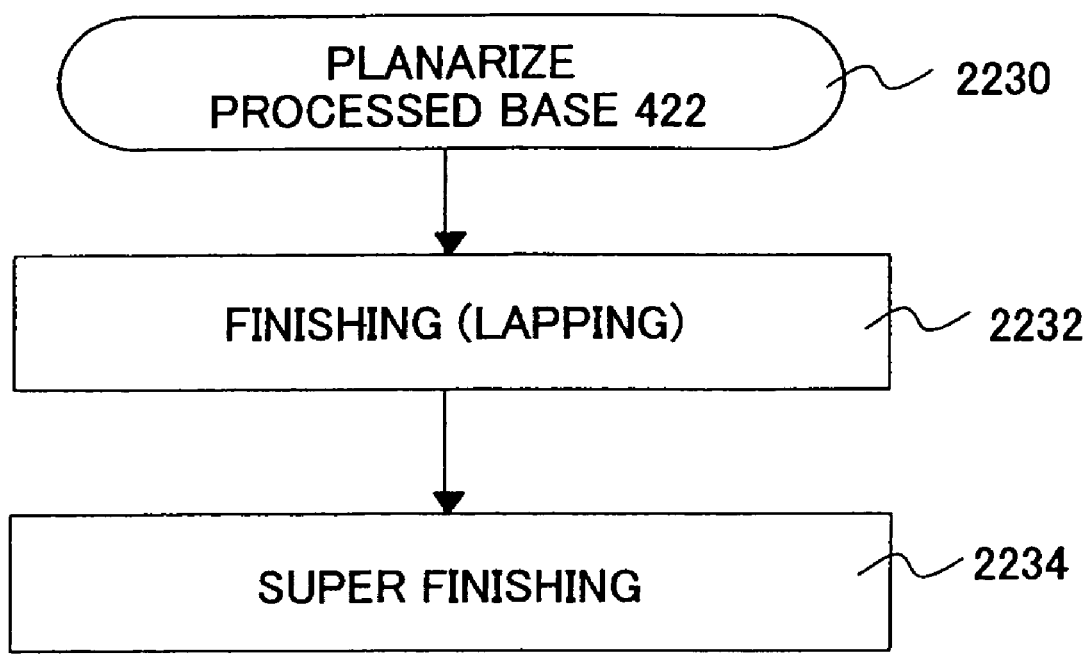
FIG. 32 is a flowchart which describes the details of the step 2230 shown in FIG. 30.

Next, the glass substrates 420a and 420b are manufactured (step 2200). FIG. 30 is a flowchart that describes the details of the step 2200. FIG. 31 is a flowchart that describes the details of the step 2210. FIG. 32 is a flowchart that describes the details of the step 2230.

Initially, a base 422 for the glass substrates 420a and 420b is produced (step 2210). The base 422 has a disc shape with both surfaces planarized, and is common to the glass substrates 420a and 420b. In producing the base 422, a block of the base 422 is cut out of a parent material (ingot) and processed into a desirable shape, such as a rectangle and a circle (step 2212). Next, the finishing process (lapping) follows for both surfaces of the base 422 (step 2214). Then, the super finishing process is performed for both surfaces of the base 422 (step 2216). Thereby, the base 422 is formed with both surfaces planarized with a surface roughness Ra of 5 nm. The base 422 is simply a glass substrate having a disc shape.

Next, the base 422 is three-dimensionally processed (step 2220). This embodiment forms a plurality of through-holes 424 for wiring in the base 422, and fills a conductive material 426 in each through-holes 424. The step 2220 causes burrs on the base 422 when forming the through-holes 424, and a residue on both surfaces due to overshooting when filing the conductive material 424 in the through-holes 424. As a result, the degree of flatness of both surfaces of the base 422 is impaired.

Next, the processed base 422 is planarized (step 2230). Initially, the finishing process (lapping) is performed for both surfaces of the base 422 (step 2232). Next, the super finishing process is performed for both surfaces of the base 422 (step 2234). Thereby, both surfaces are planarized with a surface roughness Ra of 5 nm. The step 2230 may be omitted if a silicon substrate is used instead of a glass substrate.

Next, the wiring part 428 is formed on the surfaces of the base 422. The glass substrates 420a and 420b may be different depending upon a position of the through-hole 424 and the conductive materials 426 and 428. These steps thus form pair of planer glass substrates 420a and 420b.

Figure 33:
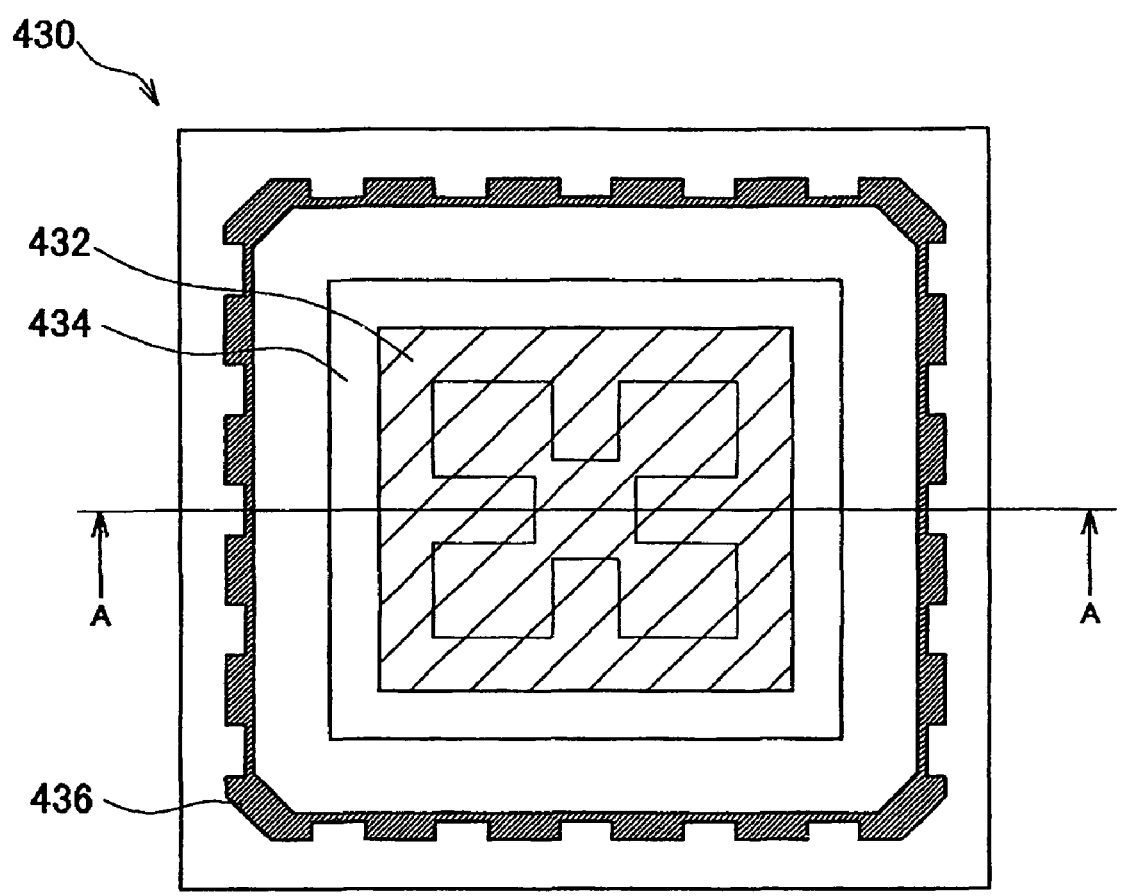
FIG. 33 is a perspective view of MEMS chips shown in FIG. 28.

Next, the MEMS chip 430 is manufactured shown in FIG. 33 (step 2300). The MEMS chip 430 includes a weight 432, a beam 434, a wall 436, and a wiring part 438. FIG. 28 corresponds to a AA section in FIG. 33.

Next, the MEMS sensor 400 is manufactured (step 2400). Here, pair of the glass substrates 420*a* and 420*b* of the conductive material 426 are connected to the wiring part 438 of the MEMS chip 430. The MEMS chip 430 is sealed in vacuum by joining the anodes of a pair of the glass substrates 420*a* and 420*b* to both sides of the wall 432 of the MEMS chip 430.

The above polishing apparatus and the polishing method may be applied to any one of the steps 2214, 2216, 2232, and 2232. In the manufacture of the substrate, highly precise polishing can be provided through preventions of dust generation and a removal of the generated dust.

Of course, a step that applies the above polishing apparatus or method may vary according to a type of the substrate. For example, in case of magnetic recording media such patterned media, the above polishing apparatus or method is applicable to a planarization process after the magnetic materials are imbedded. In case of ceramic substrates (laminated substrates), the above polishing apparatus or method is applicable to a finishing process after the wires are laminated and sintered.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

According to the present invention, a highly precise polishing apparatus configured to polish both sides of the works at once are provided.

What is claimed is:

1. A polishing apparatus configured to polish a work having two surfaces, the apparatus being configured to polish simultaneously the two surfaces, comprising:
   a carrier having a hole configured to house the work; and
   a fixing member that contacts and fixes the work located in the hole,
   wherein the fixing member includes an elastic member that applies an elastic force to the work in the hole, and
   wherein the elastic member includes a wire ring that contacts the work.

2. The polishing apparatus according to claim 1, further comprising a pad having a pattern of a convex and a concave on a polishing surface that polishes the work.

3. The polishing apparatus according to claim 1, wherein the polishing apparatus polishes the work by chemical mechanical polishing.

* * * * *

UNITED STATES PATENT AND TRADEMARK OFFICE
CERTIFICATE OF CORRECTION

PATENT NO. : 8,221,198 B2  
APPLICATION NO. : 12/155118  
DATED : July 17, 2012  
INVENTOR(S) : Fumihiko Tokura et al.

Page 1 of 1

It is certified that error appears in the above-identified patent and that said Letters Patent is hereby corrected as shown below:

Title Page, Column 1, Items (12) and (75), at Line 1, Delete "Tokukra," and insert -- Tokura, --, therefor.

Signed and Sealed this  
Second Day of July, 2013

Teresa Stanek Rea  
*Acting Director of the United States Patent and Trademark Office*